United States Patent
Rabinovich et al.

(10) Patent No.: US 6,958,647 B2
(45) Date of Patent: Oct. 25, 2005

(54) DUAL LOOP FEEDFORWARD POWER AMPLIFIER

(75) Inventors: Alex Rabinovich, Cypress, CA (US); Mark Gurvich, Costa Mesa, CA (US); Jianquing He, Cerritos, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 21 days.

(21) Appl. No.: 10/723,801

(22) Filed: Nov. 25, 2003

(65) Prior Publication Data

US 2005/0110563 A1 May 26, 2005

(51) Int. Cl.$^7$ .................................. H03F 3/66
(52) U.S. Cl. ............................ 330/52; 330/151
(58) Field of Search .................. 330/52, 151, 149; 375/297; 455/63

(56) References Cited

U.S. PATENT DOCUMENTS

| | | | |
|---|---|---|---|
| 4,379,994 A | 4/1983 | Bauman | 330/149 |
| 4,442,407 A | 4/1984 | Apel | 330/128 |
| 5,444,418 A | 8/1995 | Mitzlaff | 330/52 |
| 5,528,196 A | 6/1996 | Baskin et al. | 330/151 |
| 5,796,304 A | 8/1998 | Gentzler | 330/52 |
| 5,929,701 A | 7/1999 | Rice | 330/52 |
| 6,091,296 A | 7/2000 | Rha | 330/149 |
| 6,091,297 A | 7/2000 | Bar-David et al. | 330/149 |
| 6,091,298 A | 7/2000 | McNicol et al. | 330/149 |
| 6,172,563 B1 | 1/2001 | Trask | 330/149 |
| 6,320,461 B1 | 11/2001 | Lee | 330/52 |
| 6,340,914 B1 * | 1/2002 | Gavrilovic | 330/52 |
| 6,340,915 B1 * | 1/2002 | Blodgett | 330/52 |
| 6,774,716 B2 * | 8/2004 | Suto | 330/52 |

* cited by examiner

*Primary Examiner*—Henry Choe
(74) *Attorney, Agent, or Firm*—Paul B. Heynssens; Peter J. Meza; Hogan & Hartson LLP

(57) ABSTRACT

A feedforward amplifier. The present invention therefore provides a feedforward amplifier, comprising: a pilot reference generator that generates a pilot signal; a first carrier cancellation loop; a first error amplifier loop including a first error amplifier, wherein the pilot signal is utilized to provide gain stabilization in the first error amplifier a third loop; a second carrier cancellation loop that includes a first phase and amplitude adjuster in module and a second amplitude and phase adjuster disposed between module and module, wherein the pilot signal is utilized to control the adjustment of the second carrier cancellation loop.

8 Claims, 20 Drawing Sheets configured to illustrate loop 1A:

configured to illustrate loop 1A:

configured to illustrate loop 2B:

DUAL LOOP FEEDFORWARD POWER AMPLIFIER

CROSS-REFERENCE TO RELATED APPLICATIONS

This application is related to co-pending U.S. patent application Ser. No. 10/723,802, filed same date herewith, entitled "SYSTEM AND METHOD OF CARRIER REINJECTION IN A FEEDFORWARD AMPLIFIER," by Rabinovich et al., and also related to co-pending U.S. patent application Ser. No. 10/723,094, filed same date herewith, entitled "A SYSTEM AND METHOD OF PILOT TONE REUSE IN A FEEDFORWARD AMPLIFIER," by Rabinovich, et al., the contents of which are incorporated by reference herein.

BACKGROUND OF THE INVENTION

The present invention relates to electronic communication systems, and more particularly to systems in which multiple signals are simultaneously transmitted at varying power levels.

In electronic communication systems, it is often necessary that groups of information signals be amplified and transmitted simultaneously. For example, a cellular radio base station transmitter typically transmits signals to many active receiving mobile stations within a single geographic cell. The signals typically appear at multiple predetermined frequencies in such multi-carrier signals. Similarly, a satellite communications transponder amplifies and transmits large number of information signals destined for various participating remote stations. Because such systems customarily employ a frequency division multiple access (FDMA) scheme, in which information signals are modulated on signal carriers occupying several frequency channels within an allocated frequency band, care must be taken to avoid inter-channel interference which may corrupt signal transmissions.

One possible source of such cross-channel interference is known as intermodulation distortion (IMD), which may result when two or more signals of different frequencies are mixed. For example, if two carriers of different frequencies are amplified using a non-linear amplifier, spurious outputs occur at the sum and difference of integer multiples of the original carrier frequencies.

As described in detail below, third order intermodulation products resulting from two relatively strong signals may disrupt transmission of a third relatively weak signal being transmitted on a carrier having a frequency equal to the frequency of the intermodulation product.

Various solutions have been proposed for improving linearity and reducing inter-channel effects in multi-carrier amplifiers. One such solution is the feed-forward amplifier circuit. In the feed-forward amplifiers two or more feed-forward loops are typically used to cancel distortion. Alternative feed-forward amplifier configurations may utilize more loops to further reduce distortion. In a first loop, a portion of the signals at the input to the amplifier are fed forward and, following suitable amplitude and phase adjustment, are subtracted from the amplifier output to generate an error signal. The error signal is proportional to distortion components of the output. The first loop that generates the error signal is known as the signal-cancellation loop. The error signal is then amplified, phase-adjusted and subtracted from the amplifier output to give a corrected signal output with reduced distortion levels. This portion of the circuit is known as the error-cancellation loop.

In one design, a "pilot tone" is introduced to the first loop of the feed-forward amplifier (i.e. signal cancellation loop). Then, the amplitude and phase adjustments in the error cancellation loops are performed by varying the amplitude and phase until a desired output is obtained. The adjustments made in this manner, however, are inherently narrowband, typically giving optimal amplifier performance across a narrow frequency band.

Another technique for reducing distortion involves the addition of more cancellation loops to further improve IMD cancellation in a feed forward amplifier. The additional loops typically have additional phase and gain controls that introduce complexity to overall amplifier adjustment, as well as additional cost. Typically any small improvement in performance obtained, is typically not deemed worth the extra complexity and cost of utilizing multiple feedforward loops.

Accordingly, it would be desirable to provide other techniques which reduce intermodulation distortion at the output of feedforward power amplifiers in multi-carrier environments.

Those having skill in the art would understand the desirability of having a multiple loop feedforward power amplifier that tends to reduce distortion, with a minimum of adjustment, and additional circuitry. This type of feedforward linear amplifiers would tend to more completely cancel in-band distortion, thus allowing the linearity of the amplifier to be improved while allowing control of the multiple loop feedforward amplifier loops to be simplified.

Several attempts have been made to minimize such intermodulation distortion, notably U.S. Pat. No. 5,796,304, issued to Gentzler, U.S. Pat. No. 5,444,418 issued to Mitzlaff, and U.S. Pat. No. 5,528,196 issued to Baskin, all of which are incorporated by reference herein. These patents, along with others, have focused on feedforward amplifier topologies which aim to minimize intermodulation distortion.

Intermodulation distortion tends to cause problems in transmitters that amplify and send out multicarrier signals. The intermodulation distortion often falls in the spectrum between two of the carrier signals, and is difficult to filter out, because such a filter would likely also filter out the carrier signal, removing that signal and the associated data from the signal that is ultimately amplified by the power amplifier. Thus, it is desirable to use an amplifier, such as a feed forward amplifier, that tends to suppress intermodulation distortion without filtering.

FIG. 1 is a block diagram of a conventional feed-forward linear amplifier. An input signal is applied to coupler 100$a$ which couples portions of the input signal to delay line 140 and to main amplifier 110 via first complex gain and phase modulator 120. Main amplifier 110 produces an amplified output having intermodulation products generated due to non-linearities in main amplifier 110. A portion of the amplified output signal is coupled to summer 150 by coupler 100$b$. Delay line 140 delays the input signal with respect to the output of the amplifier 110 producing a delayed signal such that the two signals reach summer 150 at the same time, but reversed in phase where they are better served.

The output of summer (or coupler) 150 is an error signal which is coupled to auxiliary (or error) amplifier 160 via second complex gain and phase modulator 121. Auxiliary amplifier 160 increases the amplitude of the error signal producing an error correction signal. The error correction signal should be matched in amplitude to the intermodulation products (i.e. spurious component) generated by main amplifier 110 and delay line 141, but reversed in phase. The resultant vector cancellation of the intermodulation products is performed in coupler 100c where the error correction signal is subtracted from the amplified input signal. The vector cancellation must be performed with a high degree of accuracy. If the error correction signal is matched in amplitude and phase to the intermodulation products, the error correction signal can completely cancel the intermodulation products of the main amplifier. However, even with the high-precision components used in the amplifier, the error signal in reality can not completely cancel the spurious components generated by main amplifier 110. In general, complete cancellation requires that the error correction signal be maintained with greater than 0.5 degrees phase accuracy and 0.1 dB amplitude accuracy which is difficult to achieve in production.

The feed-forward technique can be used in a multi-carrier power amplifier to effectively suppress intermodulation products, but at the cost of lower power efficiency and a high demand on complexity and component cost. In particular, high power multi-carrier power amplifiers are difficult to master in production. In addition some distortion typically remains at the output of the feedforward power amplifier.

It may be desirable to further reduce the distortion in the output of a feed forward power amplifier by adding one or more additional feed forward compensation loops.

Vector cancellation can be degraded by small deviations in delay, phase or amplitude from an initial set of optimized values of control signals to produce a desired delay, phase and amplitude response. The basic structure described above is relatively sensitive to both long and short term component values that change due to aging, operating conditions or temperature.

In order to address these problems, some feedforward amplifiers have incorporated automatic control processes in an attempt to correct or adjust one or more vector modulators. Correction is attempted in a direction which restores and maintains the cancellation, by utilizing one or more pilot signals. Pilot signals are desirable because they are always present and have known characteristics. The pilot signals are injected into the main power amplifier output path. The automatic control process minimizes, to the extent possible, the pilot signal amplitude monitored at the feedforward amplifier output. Due to the finite bandwidth in a practical system, vector modulator and delay values corresponding to minimization of the pilot signal typically do not coincide precisely with the modulator and delay values required to achieve the lowest IM distortion signal output.

U.S. Pat. No. 5,528,196 to Baskin describes a feedforward amplifier in which a pilot tone is utilized in this manner. All IM distortion cancellation occurs within a single vector summer.

In addition to environmental and aging factors, the observed intermodulation distortion (IMD) performance of a power amplifier is sensitive to changes in output power, the number of carriers and their frequency separation. For some radio services, including cellular communications, the transmitted output power is commonly required to be varied rapidly over a wide range. Under these conditions, the automatic control system provides an incorrect, or delayed, estimate of the phase and amplitude adjustments used in the feedforward amplifier, and as a result, the IMD performance is degraded.

When the performance of a feedforward system is limited by the accuracy in estimating the phase and amplitude adjustment control signals, IMD performance may be improved by adding additional stages of vector cancellation.

FIG. 2 illustrates a prior art dual feedforward system according to U.S. Pat. No. 5,444,418 issued to Mitzlaff. In FIG. 2, a vector modulator is adjusted according to information based on the degree of cancellation of a pilot signal. In this system, alternate embodiments place a first vector modulator 310 in the main amplifier path, shown as being implemented through power splitter 312, or in the delay path through the delay element 352.

In this system, first loop controller 350 adjusts the controls of vector modulator 332 so as to minimize the pilot signal power measured at sampling point 340 by pilot receiver 344 via switched path 342. Similarly, second loop controller 370 adjusts the controls of vector modulator 360 so as to minimize the pilot signal power measured at sampling point 368 by pilot receiver 344 via switched path 342.

The topology of the feedforward system of FIG. 2 incorporates multiple closed loop structures that are dependent on each other, and must therefore be adjusted according to the control sequence explicitly described and/or used by the system. Should a different input signal be used, the characteristics of the input signal vary over time, or the components age or degrade over time, the amplifier will not maintain adequate performance. That is adjusting any one of the four loops will cause the performance of the other loops to change. Typically an explicit sequence of adjustments are utilized to minimize the disruptions to the control of the remaining loops where one of the loops is adjusted.

In addition, when a control loop is selected to be adjusted according to the specified sequence, the control points (vector modulator settings) of the remaining loops are temporarily frozen at their previous values while the control point of the selected loop is adjusted. As such, switch 342 must be used to switch between the first loop coupler 340 and the second loop coupler 368 to properly correct the IM distortion correction of this type of amplifier. This switching introduces additional errors into the feedforward amplifier that could prevent such a topology from being applicable to certain applications.

SUMMARY OF THE INVENTION

The present invention therefore provides a feedforward amplifier, comprising: a pilot reference generator that generates a pilot signal; a first carrier cancellation loop; a first error amplifier loop including a first error amplifier, wherein the pilot signal is utilized to provide gain stabilization in the first error amplifier a third loop; a second carrier cancellation loop that includes a first phase and amplitude adjuster in module and a second amplitude and phase adjuster disposed between module and module, wherein the pilot signal is utilized to control the adjustment of the second carrier cancellation loop.

In accordance with a, further aspect of the present invention a power amplifier, comprising: an input comprising a multicarrier signal; a pilot generator that generates a pilot signal; a first loop that utilizes the pilot signal, wherein the first loop comprises a main amplifier block that amplifies the multicarrier signal, wherein the main amplifier block includes an adjustable vector modulator; a second loop that includes an error amplifier block that includes a first error amplifier; and a feedback path between the first error amplifier and the main amplifier block that allows the second loop the reuse the pilot signal to maintain a phase and an amplitude of the main amplifier block is provided.

Many of the attendant features of this invention will be more readily appreciated as the same becomes better understood by reference to the following detailed description considered in connection with the accompanying drawings.

BRIEF DESCRIPTION OF THE DRAWINGS

Referring now to the drawings in which like reference numbers represent corresponding parts throughout.

DETAILED DESCRIPTION OF EMBODIMENTS

In the following description, reference is made to the accompanying drawings which form a part hereof, and in which is shown by way of illustration, a specific embodiment in which the invention may be practiced. It is to be understood that other embodiments may be utilized and structural changes may be made without departing from the scope of the present invention.

Figure 1:
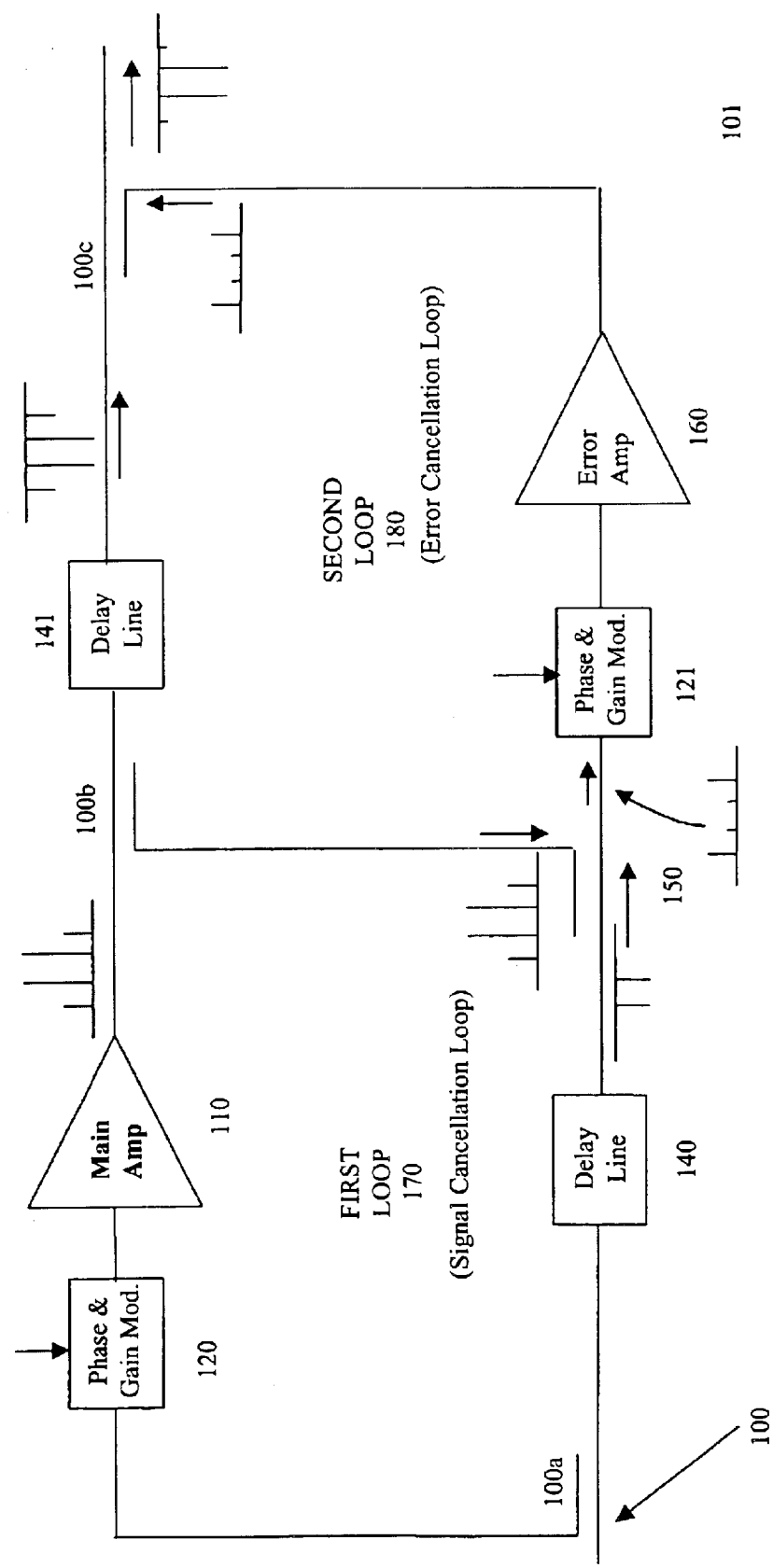
FIG. 1 is a block diagram of a conventional feedforward amplifier.
Figure 2:
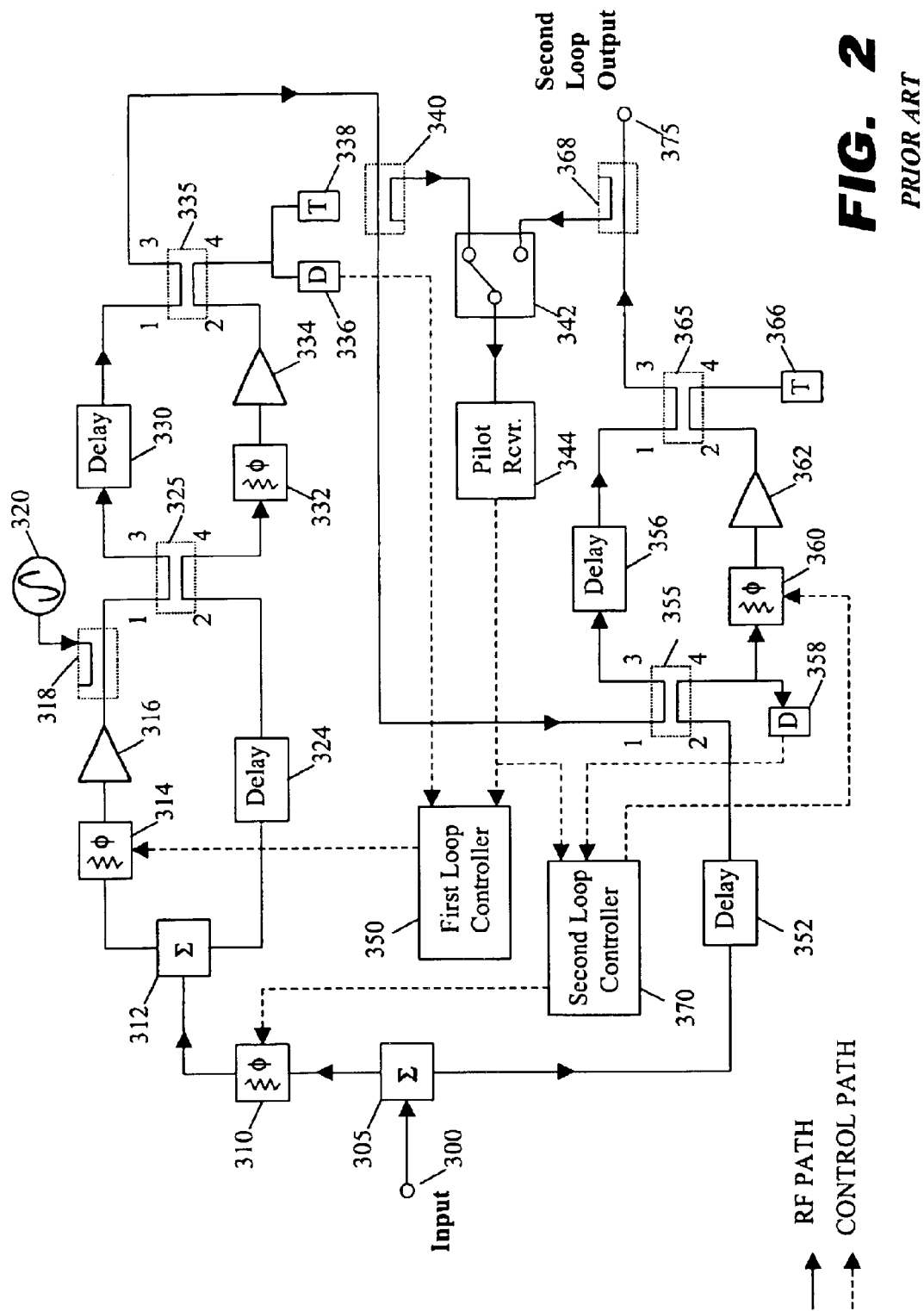
FIG. 2 is a block diagram of a conventional multiple loop feedforward amplifier.
Figure 3:
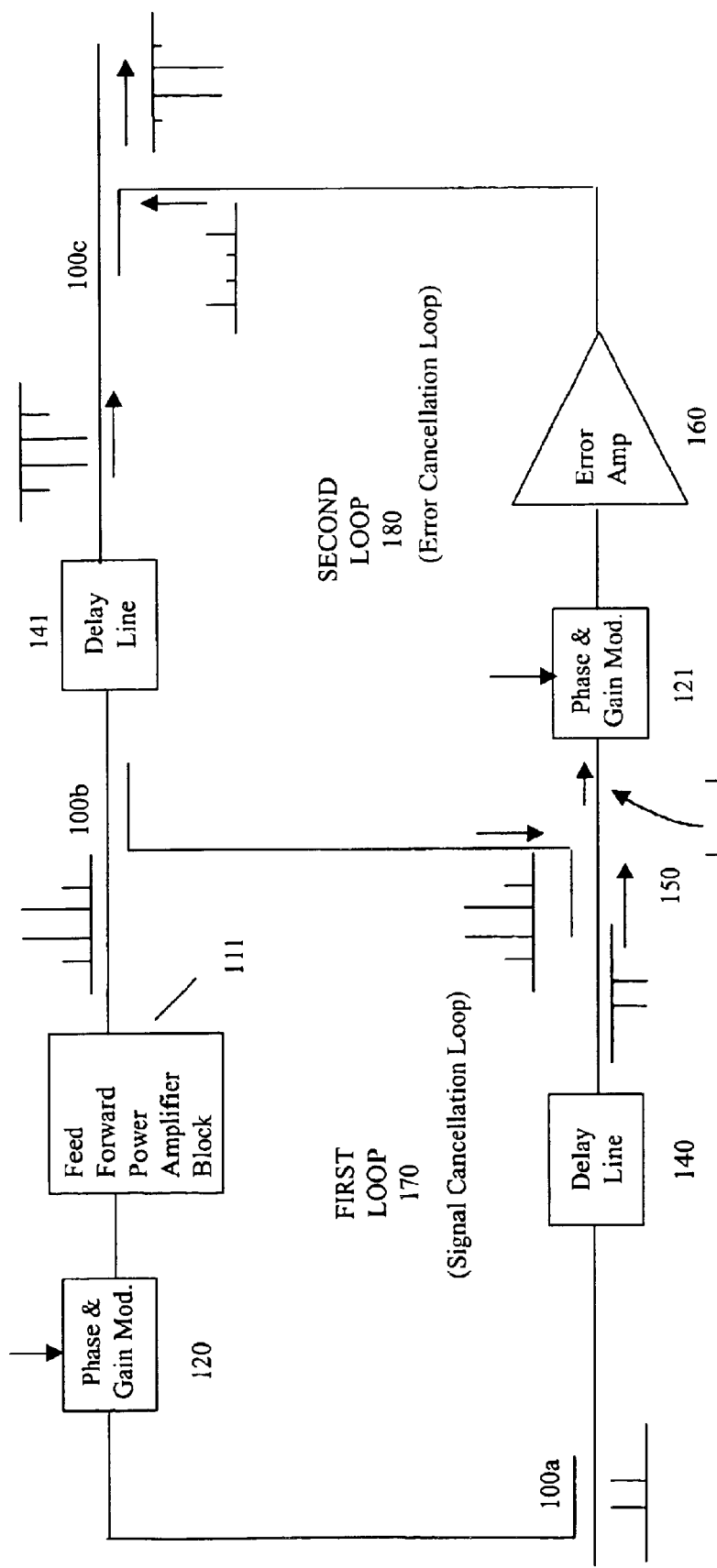
FIG. 3 is a block diagram of conventional dual loop feedforward power amplifier in which a second feedforward power amplifier replaces the main amplifier of FIG. 1.

FIG. 3 is a block diagram of conventional dual loop feedforward power amplifier. FIG. 3 is the same as FIG. 1 except that a second feedforward power amplifier 111 replaces the main amplifier 110 of FIG. 1 which was shown as a single gain block, such as a simple cascade of one transistor amplifiers of fixed gain, that do not have feedback or feedforward control.

Thus, the first feedforward amplifier is embedded as a gain block in a second feedforward amplifier. Such an arrangement is typically called a dual loop feedforward amplifier (DLFFA). Those skilled in the art will appreciate that various embodiments of feedforward amplifier circuits may be used for the first and second feedforward amplifiers. Those skilled in the art will also realize that the main amplifier of the first and second feedforward amplifiers may be grouped together in one amplifier block, since a typical goal of adding a second set of feed forward loops is to reduce distortion of the main amplifier if the first feed forward amplifier, and not to reduce gain.

Figure 4:
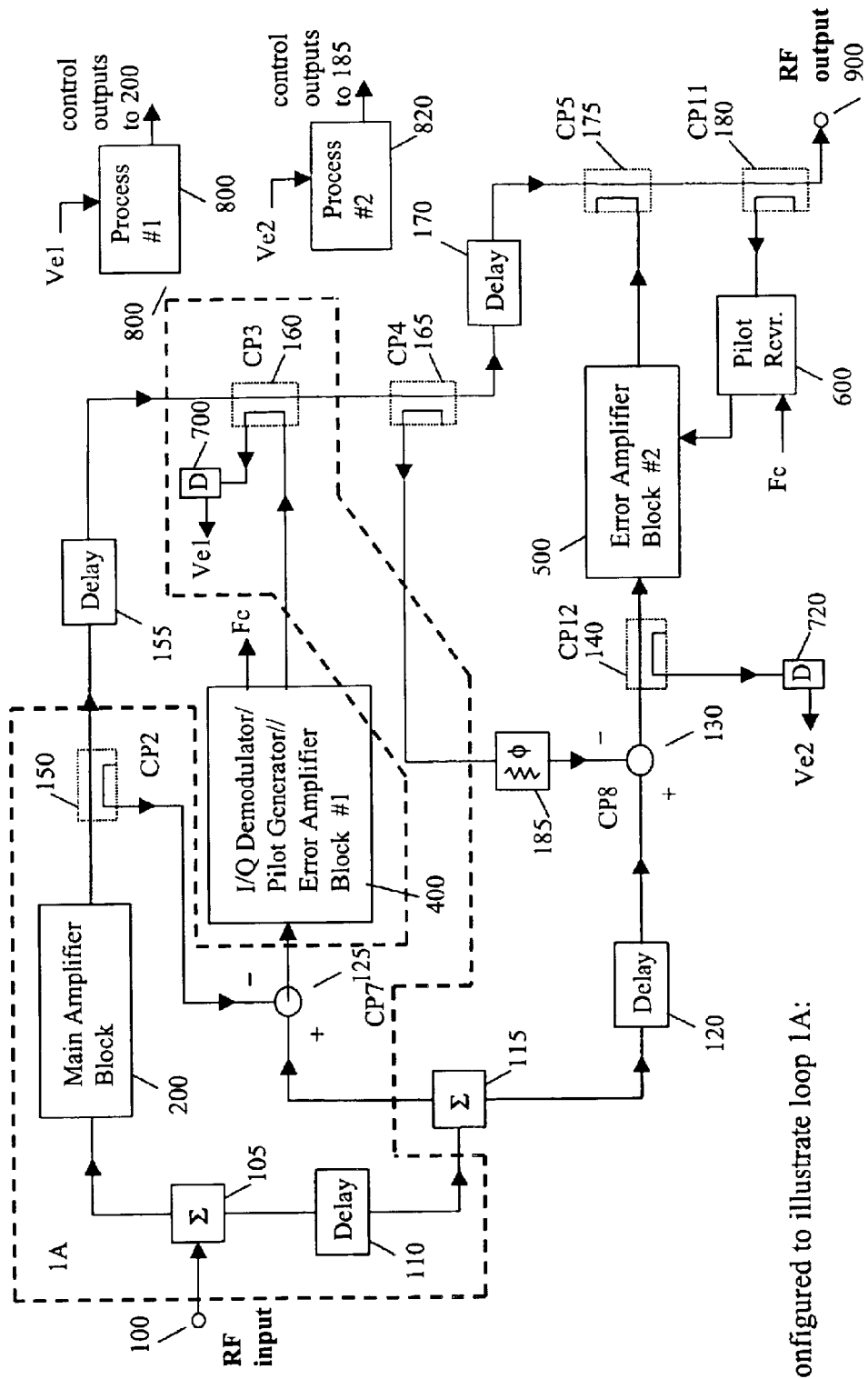
FIG. 4 is an block diagram of an embodiment of the invention including a dual loop feedforward power amplifier (DLFFPA) including, phase and gain control of the first error amplifier block (400), carrier reinjection at coupler CP3 (160) and pilot tone reuse across loops 1A and 2A.
Figure 8:
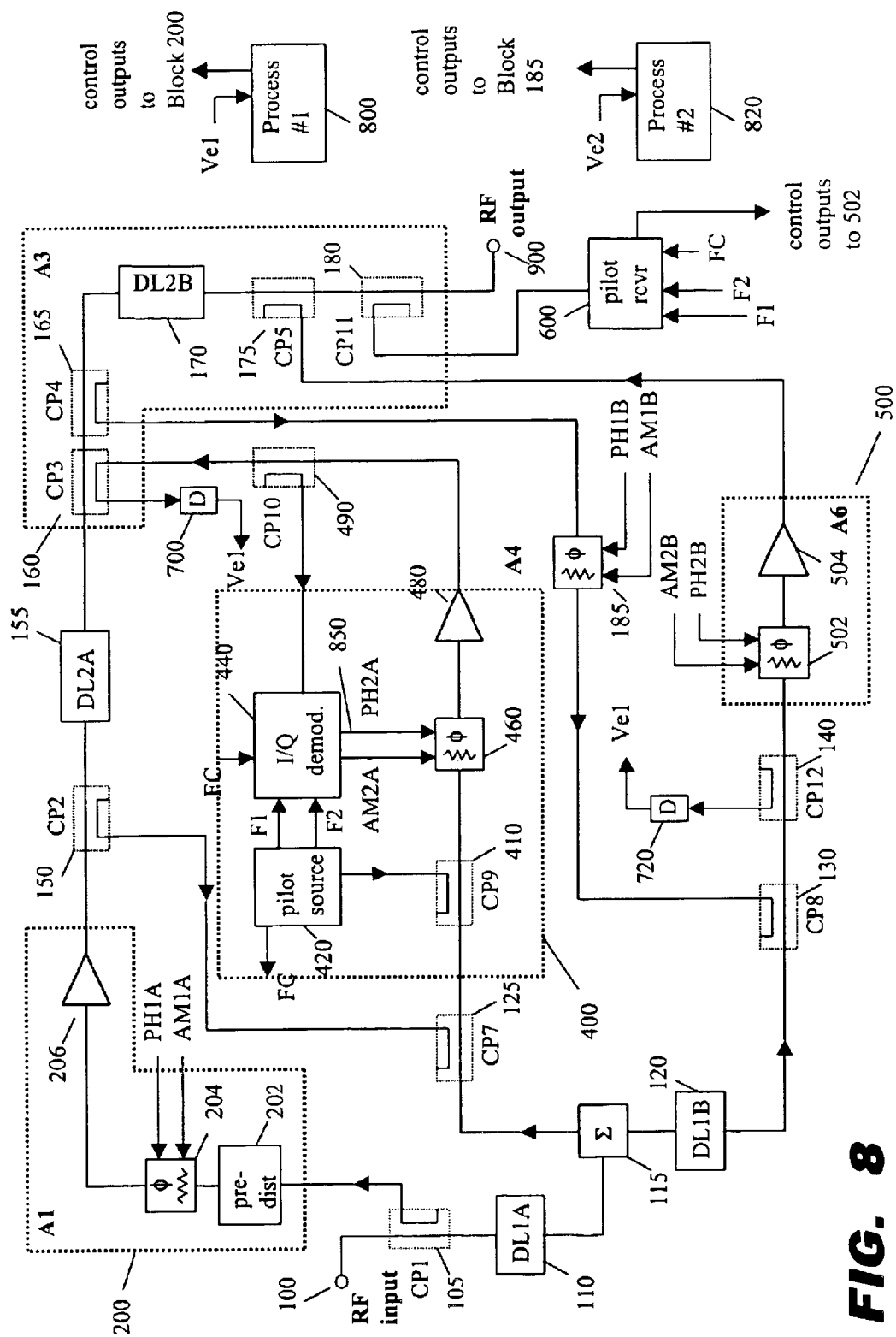
FIG. 8 is a more detailed view of the overall block diagram of the embodiment of the present invention shown in FIG. 3.
Figure 11:
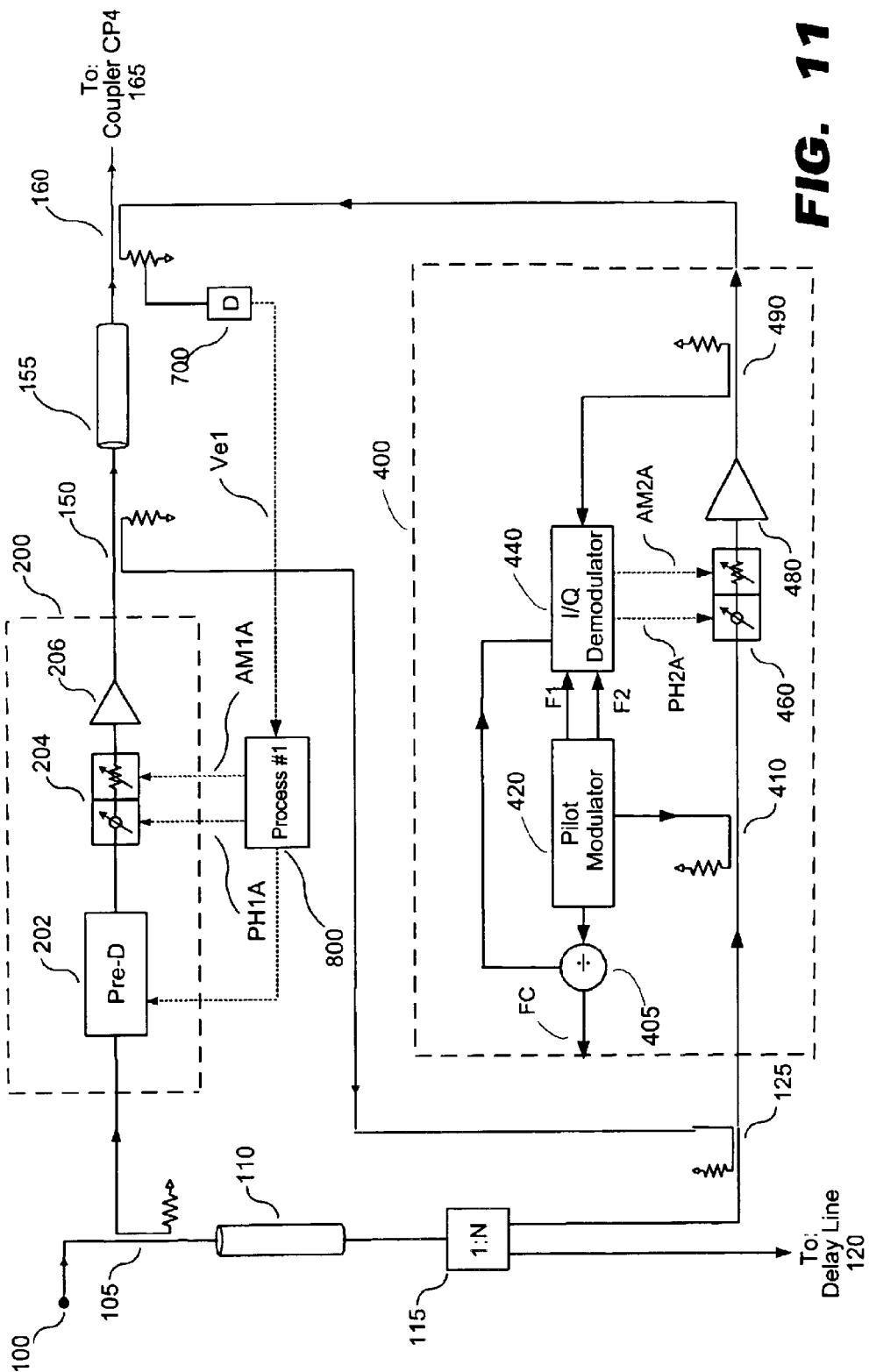
FIG. 11 illustrates an embodiment of a feedforward amplifier (of FIG. 3) that utilizes carrier reinjection.

FIG. 4 is a block diagram of a feedforward amplifier having four independently functioning feedback, or automatic control loops, for reducing the intermodulation distortion characteristics of feedforward amplifiers. Additional details relating to reinjection of the carrier signal are shown in FIGS. 8 and 11. The input signal applied at input port 100, includes multiple carrier(s) is first divided at splitter 105 between the main amplifier block 200 and delay path 110.

Subnetwork 1A comprises splitter 105, delay path 110, main amplifier block 200, couplers 125,150 and 160, and load monitoring detector 700. A goal of subnetwork 1A is to provide a carrier cancellation signal for the first auxiliary amplifier 400. A further goal of subnetwork 1A is to reinject the carrier into the feedforward path, which allows for reduction of output losses associated with the injection coupler CP3 160.

Subnetwork 1A does not provide maximum IM distortion reduction as the prior art topologies attempt to perform. Because of the use of carrier reinjection, multiple cascaded stages of IM distortion are now possible, and more complete and accurate IM distortion reduction can be performed.

A portion of the main amplifier 200 output spectrum, comprising both carrier(s) and IM distortion signals is extracted through coupler 150 and applied to an input of the carrier cancellation junction 125, represented as an idealized subtraction junction, and physically realized using a coupler, or other equivalent circuitry known to those skilled in the art. The output of the delay path 110 is further divided by splitter 115 and applied to the input of the coupler 125 and delay path 120.

Figure 5:
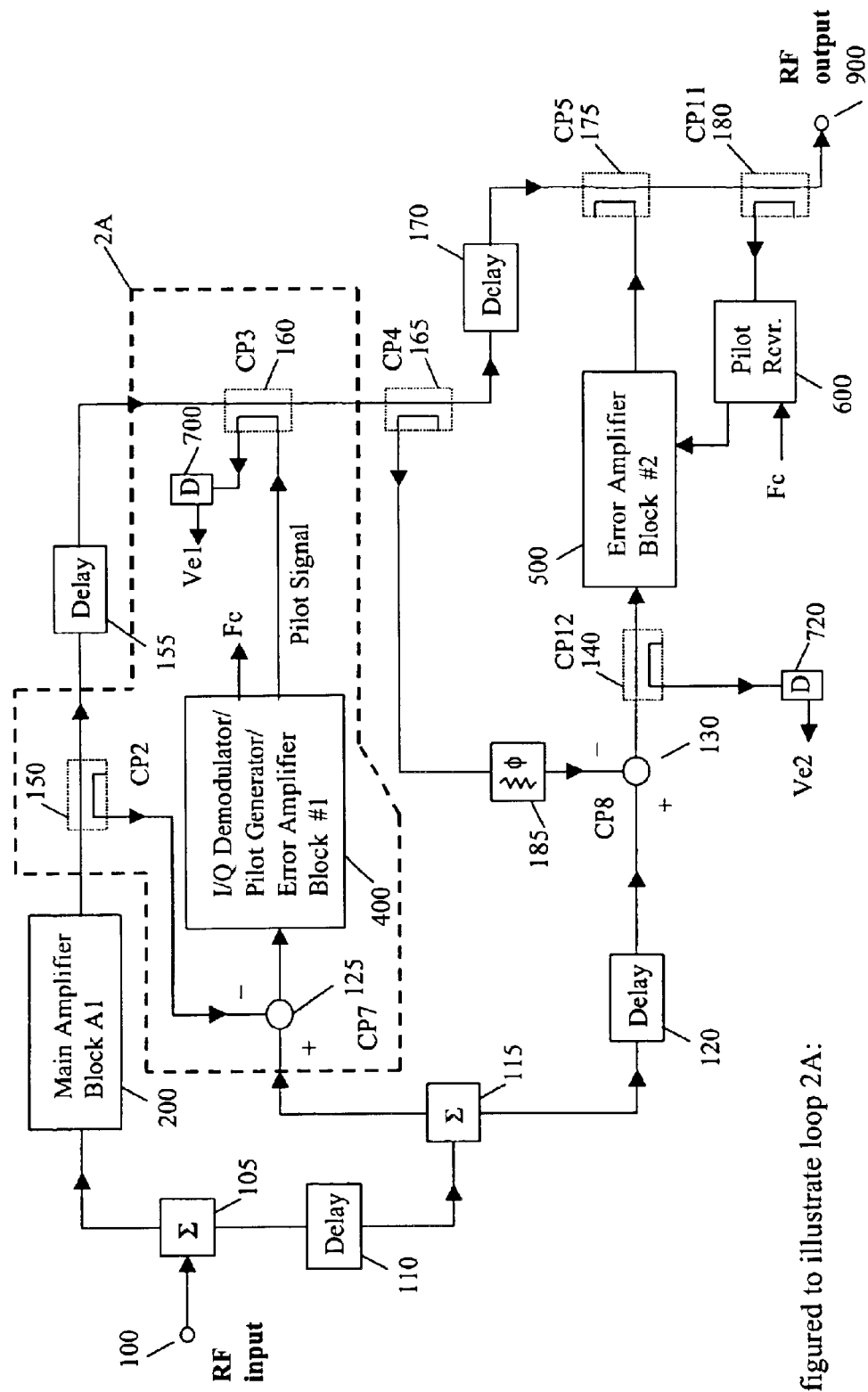
FIG. 5 is an overall block diagram of an embodiment of the present invention in which loop 2A performs a reduction of IM distortion.

FIG. 5 is a block diagram of the present invention in which loop 2A is described. The subnetwork 2A comprises couplers 125, 150 and 160, I/Q demodulator/pilot generator/ error amplifier block 400, and terminated detector 700, and exists for the primary purpose of stabilizing the insertion phase and gain of the first error amplifier.

The output of coupler 125, consisting of primarily IM distortion signals, is input to the I/Q demodulator/pilot generator/error amplifier block 400. The I/Q demodulator/pilot generator/error amplifier includes a conventionally constructed pilot source, a conventionally constructed I/Q demodulator, a conventionally constructed phase and amplitude shifter, a conventionally constructed error amplifier and a conventionally constructed coupler.

In conventional feedforward amplifiers incorporating closed loop control of the IM distortion cancellation portion of the amplifier, the amplitude of the IM signals in the output spectrum constitutes an error input to the control system. In the present embodiment of the invention, a closed control loop is used to force the insertion phase and gain of the error amplifier block 400 to remain constant despite performance variations due to aging and shifts in bias and operating point. This may be accomplished by the use of pilot signal frequencies(s) that are noncoincident with the input signal (s), but are still within the error amplifier operating frequency range.

As will be described in more detail in FIG. 8 below, the I/Q demodulator/pilot generator/error amplifier block 400 (of FIG. 8), the IQ demodulator 440 (of FIG. 8) compares the gain and phase of the pilot signal(s) coupled to pilot injection coupler 410 (of FIG. 8) versus pilot signal(s) sampled by the coupler 490 (of FIG. 8) disposed at the error amplifier output 480 (of FIG. 8) in order to generate gain and phase error control signals that are applied to the phase and gain control 460 of the first error amplifier block 400.

The insertion phase and gain of the passive components in the signal path including splitters 105, 125 and 115, delay 110, disposed at the input to the error amplifier and coupler 160 disposed at the output of the error amplifier is relatively much more stable than that of the unstabilized amplifier 480. Stabilization of these parameters yields a level of preliminary IM distortion cancellation, as measured at the output of coupler 160, that is relatively resistant to environmental conditions and the state of the remaining loops 1A, 1B, or 2B.

An aspect of the present invention, shown in the topology described above, makes the pilot signal available for reuse, whereas related art approaches minimize the pilot signal, making reuse of the pilot signal impractical or impossible. As such, loop 2B can use the pilot signal to even further reduce intermodulation distortion.

Figure 6:
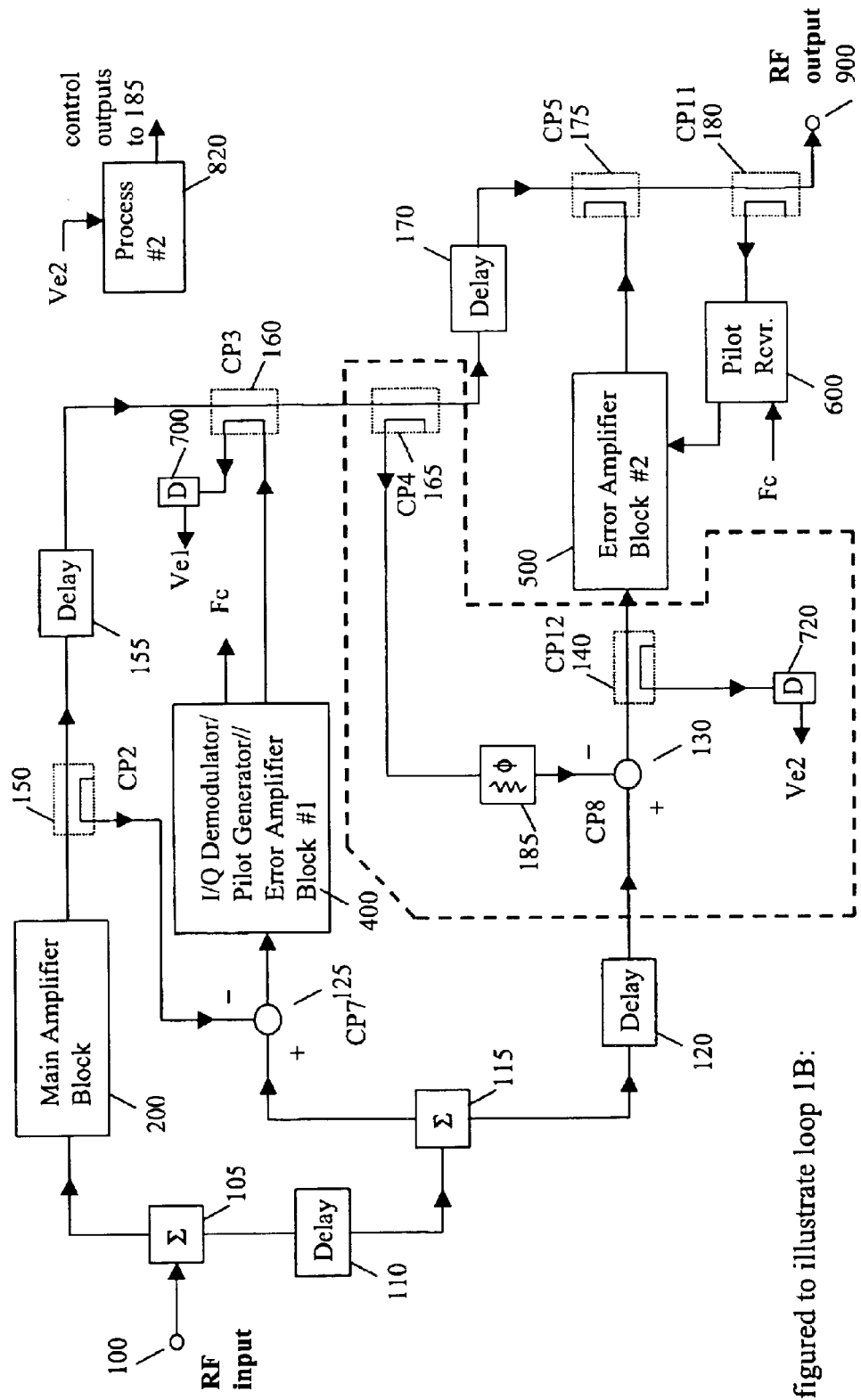
FIG. 6 is an overall block diagram of an embodiment of the present invention in which loop 1B performs carrier cancellation.

FIG. 6 is a block diagram of the present invention in which loop 1B is described. The subnetwork 1B comprises couplers 130, 140 and 165, vector modulator 185, and carrier cancellation detector 720, and exists for the primary purpose of carrier cancellation at the input of the second error amplifier 500.

A portion of the loop 2A output spectrum (as defined at the main input of coupler 165), comprising both carrier(s) and IM distortion signals, is extracted through coupler 165, coupled through vector modulator 185, and applied to an input of the junction 130, represented as an idealized subtraction junction, and physically realized using a coupler. The output of delay path 120, comprising the input carrier(s) signals is applied to the remaining input of the coupler 130. Modulator 185 is adjusted so that carrier(s) signal cancellation or minimization occurs in junction 130. The spectral input to second error amplifier 500 comprises primarily the remaining IM distortion terms of the loop 2A output spectrum. Modulator 185 is controlled by independent gain and phase controls AM1B and PH1B respectively. The envelope signal voltage level at the termination 720 is determined by a detector, and is utilized by control process 820 to adjust gain and phase controls AM1B and PH1B.

Figure 7:
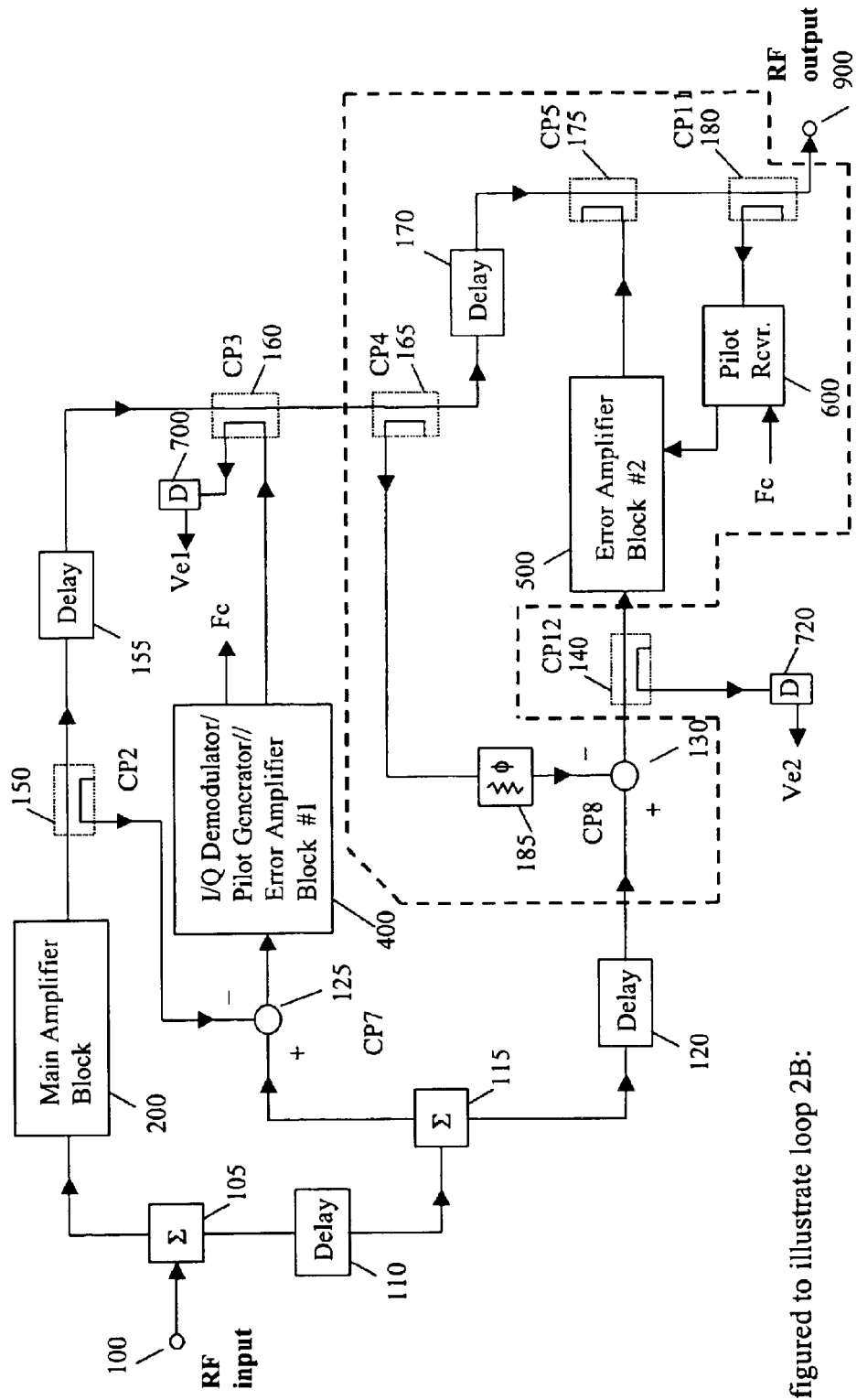
FIG. 7 is an overall block diagram of an embodiment of the present invention in which loop 2B performs reduction of IM distortion.

FIG. 7 is a block diagram of the present invention in which loop 2B is described. The subnetwork 2B, comprises couplers 130, 165, 175 and 180, vector modulator 185, error amplifier block 500, and pilot signal receiver 600, and exists for the primary purpose of providing a second stage of reduction of IM distortion at the feedforward amplifier output.

The output of carrier cancellation coupler 130, consisting of primarily IM distortion signals, is input to the second error amplifier block 500.

FIG. 8 is a block diagram of the present invention that shows details of the error amplifier block 400. Loops 1A, 2A, and 2B, as described with respect to FIGS. 5, 6, and 7, operate simultaneously via common signal channels, namely AM1A, PH1A, AM1B, PH1B, AM2A, PH2A, AM2B, and PH2B, which are shown in FIG. 8.

Main amplifier block 200, comprises an optional predistortion network 202, a vector (or I/Q, or gain and phase shifter) modulator 204, and a power amplifier 206. I/Q modulator 204 is adjusted so that carrier signal cancellation or minimization occurs in 125, the spectral input to pilot generator/error amplifier thereby comprising primarily the remaining IM distortion terms of the main amplifier 200 output. I/Q Modulator 204 is controlled by independent phase and gain controls PH1A and AM1A respectively. Block 500 comprises vector modulator 502 and second error amplifier 504. Modulator 502 is adjusted so as to minimize the amplitude of the pilot signal at final output coupler 180.

Figure 9:
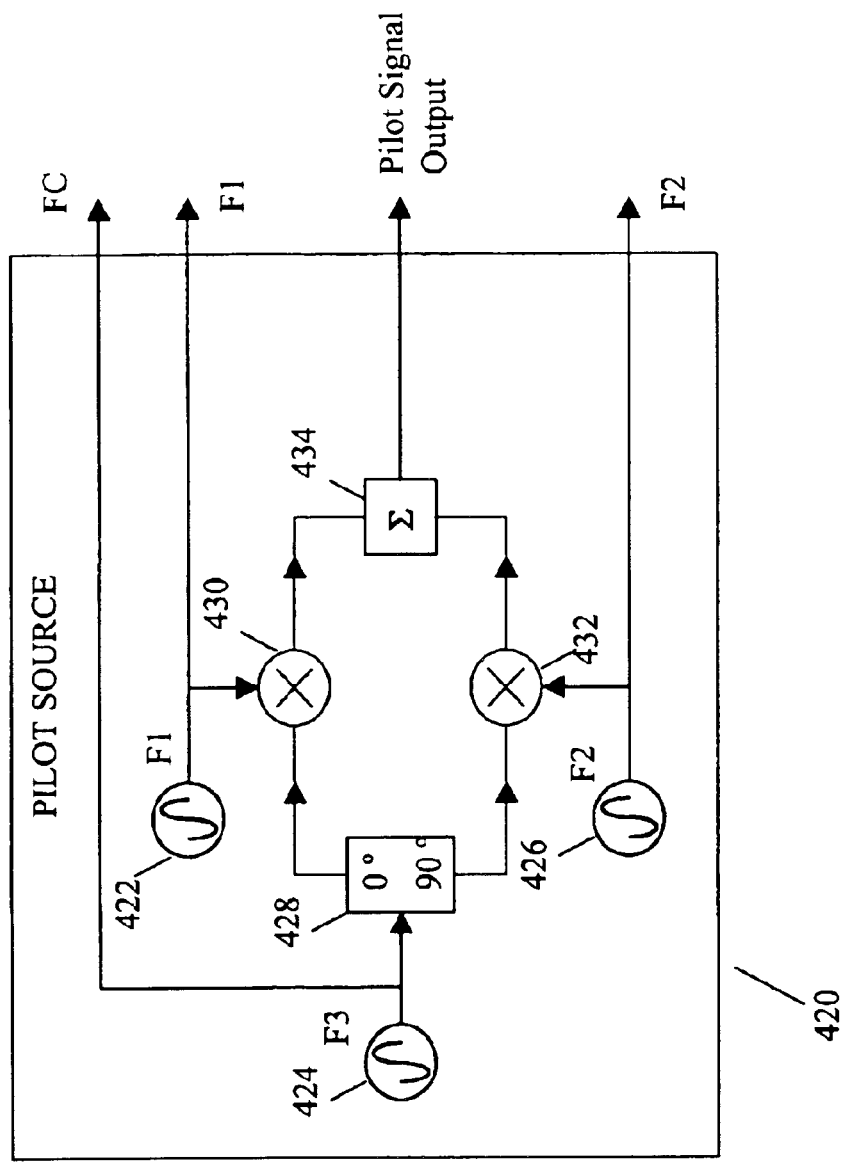
FIG. 9 is a detailed view of a quadrature modulated signal generator or pilot source.

FIG. 9 is a block diagram of a pilot signal generator 420 (of FIG. 8). The quadrature modulated signal generator 420 comprises a sinusoidal signal oscillator 424 operating at frequency FC, a power splitter 428 having two output ports, closely matched in amplitude but differing in relative phase by 90 degrees (commonly termed a quadrature, or IQ, splitter or divider) at frequency FC, signal multipliers 430 and 432 (commonly termed mixers), a power summer 434 having two output ports, closely matched in amplitude and relative phase at frequency FC (commonly termed an in-phase summer or combiner), and two sinusoidal signal oscillators 422 and 426, operating at different frequencies F1 and F2. The output of the summer 434 is a quadrature modulated pilot signal.

In other embodiments of the invention, signal oscillators 422 and 426 may be replaced by band limited, pseudo random sequences that have minimal cross correlation properties.

Figure 10:
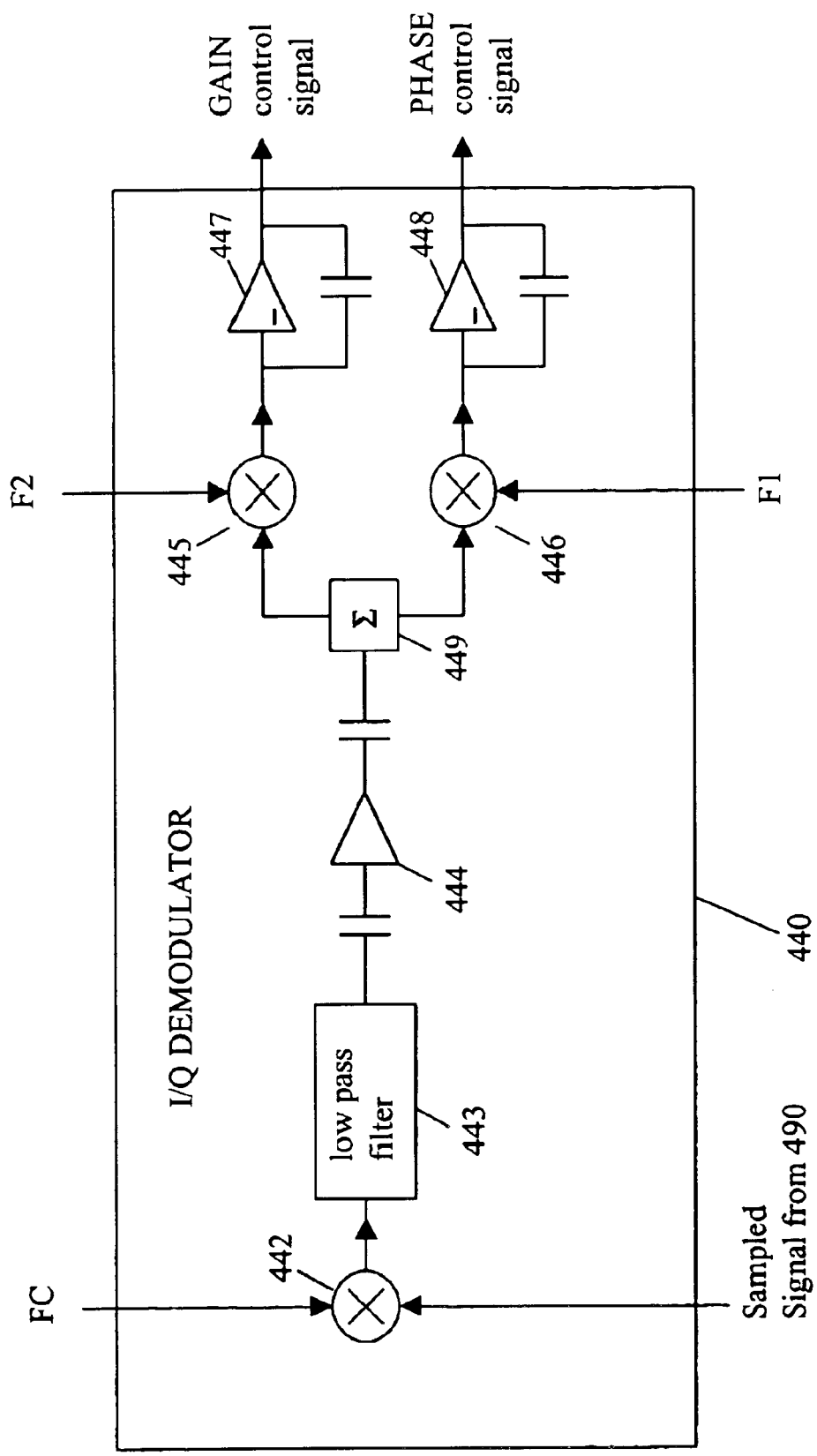
FIG. 10 is a detailed view of a pilot signal demodulator and vector modulator interface or I/Q demodulator.

FIG. 10 is a block diagram of a pilot signal demodulator and vector modulator interface 440 (of FIG. 8). The IQ demodulator 440 comprises RF multiplier 442, low pass filter 443, AC coupled amplifier 444, in-phase power divider 449, low frequency multipliers 445 and 446, and integrators 447 and 448.

Referring back to FIG. 8, one output of divider junction 115 (of FIG. 8) is the positive input to summing junction 125 (of FIG. 8). The pilot generator (not shown) that is part of pilot block 400 (of FIG. 8) creates reference input signals, Fc, that are coupled to pilot receiver 600 (of FIG. 8), and an output pilot signal that is coupled via coupler 160 with the delayed output of main amplifier 200 also at coupler 160 (of FIG. 8).

FIG. 11 illustrates the process of carrier reinjection. A controlled level of carrier (or carriers) signal voltage from the error amplifier reinjected at coupler 160 can cancel or minimize the carrier (or carriers) signal voltage normally present at the coupler termination 700, provided vector modulator 204 is properly adjusted. If the additional carrier (s) signal from the error amplifier were absent, the carrier (or carriers) signal normally present at the coupler termination 700 would be wasted as heat. The envelope of the carrier (or carriers) signal voltage level, at the termination 700, is determined by a detector, and is utilized by control process 800 to adjust phase and gain controls AM1A and PH1A. Process 800 also controls the state of predistortion network 202.

Figure 12:
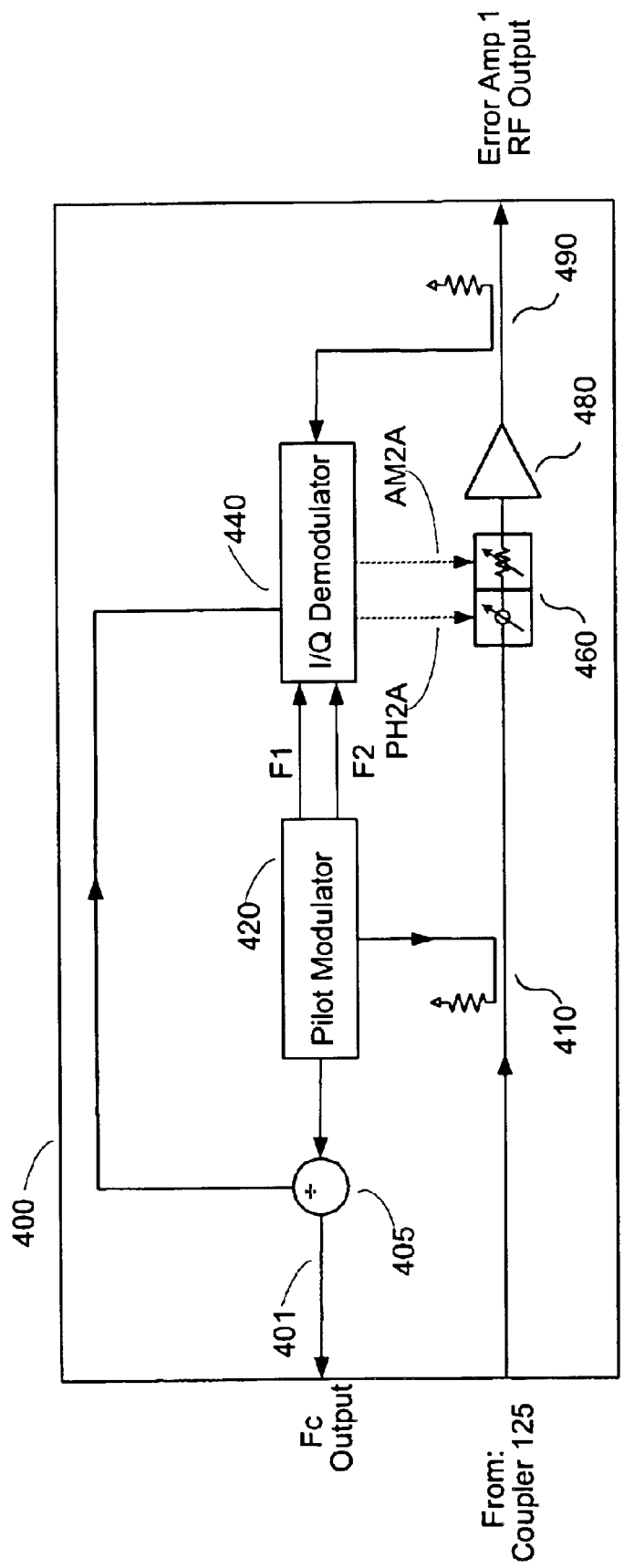
FIG. 12 is a block diagram showing the interconnection of the pilot source and I/Q demodulator previously shown in FIG. 8.

FIG. 12 is a block diagram showing the interconnection of the pilot source 420 and I/Q demodulator 440 of block previously shown in FIG. 8. The I/Q demodulator/pilot generator/error amplifier block 400 (of FIG. 8) comprises a pilot signal injection coupler 410, quadrature modulated signal generator 420, in phase/quadrature (IQ) demodulator 440, vector modulator 460, error amplifier 480 and output coupler 490. The pilot signal injection coupler 410 receives inputs comprising a pilot signal from the pilot generator 420 and signal distortion from coupler 125. The pilot signal injection coupler 410 generates an output signal that is coupled to the phase and gain adjustment circuit or "vector modulator" 460. The vector modulator 460 also receives amplitude and phase control signals AM2A and PH2A from the I/Q demodulator 440, and generates an error signal that is coupled into error amplifier 480, amplified, and then coupled as an input to output coupler 490. The quadrature modulated pilot signal generator 420 also outputs signals F1, F2 and FC to the in phase/quadrature (IQ) demodulator 440. The output coupler 490 generates an error amplified output signal, that is also coupled to the in phase/quadrature (IQ) demodulator 440.

Figure 13A:
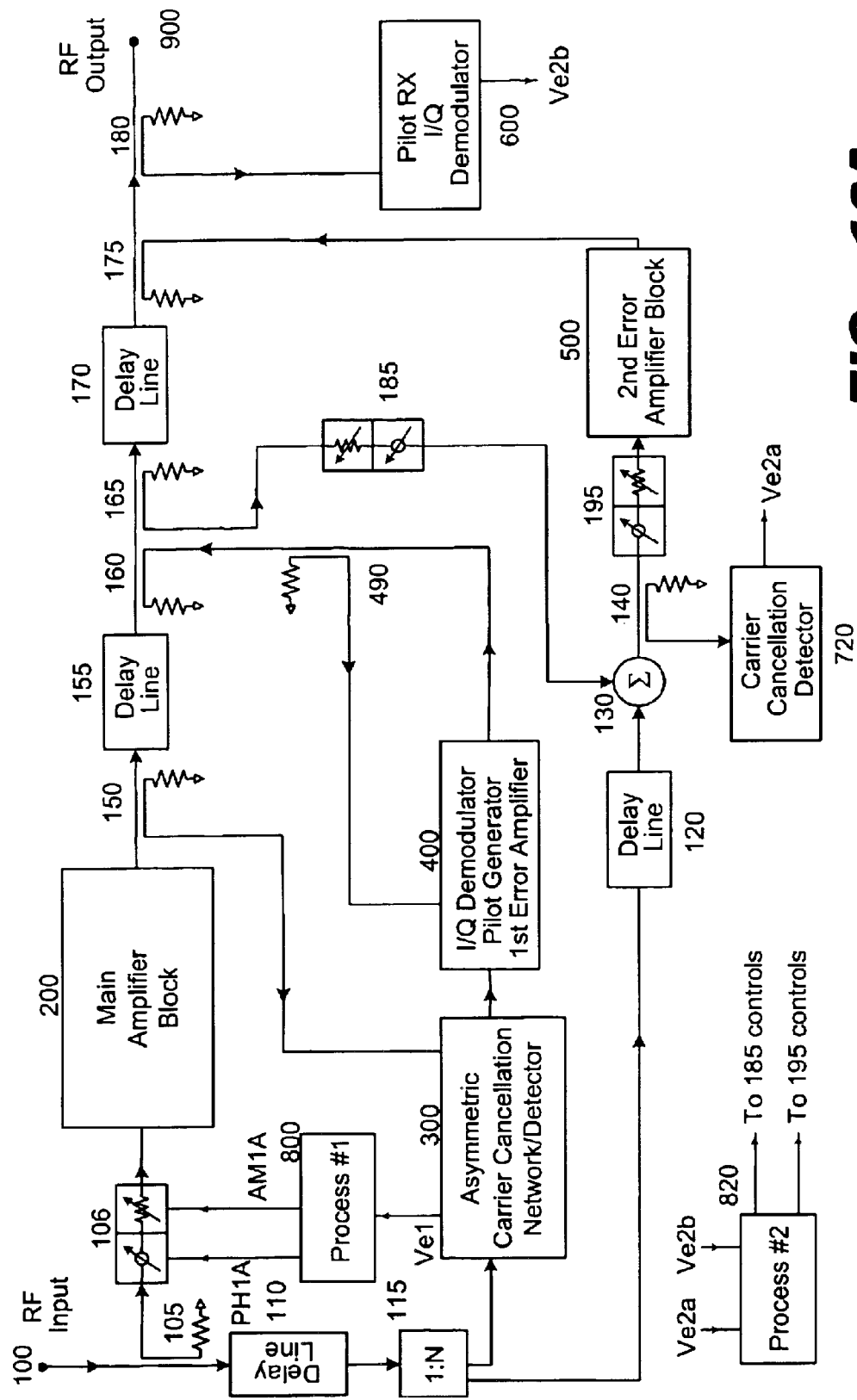
FIG. 13A is an overall block diagram of a second embodiment of the invention that is a dual loop feedforward power amplifier (DLFFPA) including, an asymmetric carrier cancellation detector.

FIG. 13A is an overall block diagram of another embodiment of the invention; a dual loop feedforward power amplifier (DLFFPA) that reuses a pilot tone and that includes an asymmetric carrier cancellation network and detector. The main gain path of dual loop feed forward power amplifier includes an RF input 100, a coupler 105 and phase and gain adjustment circuit 106, a main amplifier block 200, a coupler 150, a delay line 155, a coupler 160, a coupler 165, a delay line 170, a coupler 175, a coupler 180, an RF output 900. A pilot receiver I/Q demodulator 600 is coupled to the main amplifier path coupler 180. The carrier cancellation loops include a delay line 110, a divider 115, an asymmetric carrier cancellation network detector 300, an I/Q demodulator/pilot generator/first error amplifier block 400, a coupler 190, a gain and phase adjustment circuit 185, a delay line 120, a summing junction 130, a coupler 140, a carrier cancellation detector 720, a gain and phase adjustment circuit 195 and a second error amplifier block 500.

The RF input signal 100 is input directly into delay line 110 and a portion of the RF input signal is also coupled via coupler 105 to gain and phase adjustment circuit 106. Gain and phase adjustment circuit 106 is controlled by the output signal of Process No. 1, 800. The gain and phase adjustment circuit generates an output signal that is fed to the main amplifier block 200. The main amplifier block 200 amplifies the input signal and produces an output signal that is coupled to the delay line 155. The output of the main amplifier block 200 is also coupled via coupler 150 to the asymmetric carrier cancellation network detector 300. The output of the main amplifier block 200 is delayed by delay line 155 and coupled to another delay line 170 which further delays the signal. The output of delay line 170 is coupled to the RF output 900.

A portion of the output of delay line 155 is coupled via coupler 165 to the gain and phase adjustment circuit 185 and after the signal is gain and phase adjusted, it is fed to summing junction 130. A portion of the output signal delay line 170 is coupled via coupler 180 to pilot receiver I/Q demodulator block 600. The pilot receiver I/Q demodulator block generates an output signal Ve2b which serves as one of the inputs into Process No. 2.

The portion of the of delay line 155 that is coupled via coupler 165 to the gain and phase adjustment circuit 185 is gain and phase adjusted according to a first control signal output from Process No. 2.

The RF input signal 100 is coupled to delay line 110 and then passed along to divider 115. Divider 115 has two outputs, a first of which is coupled to the asymmetric carrier cancellation network detector block 300 and the second which is coupled to delay line 120. The asymmetric carrier cancellation network detector block 300 also receives a portion of the output signal's main amplifier block 200 which is coupled via coupler 150 to asymmetric carrier cancellation network detector block 300. In response, the asymmetric carrier cancellation network detector 300 generates output signals Ve1 and another output that is coupled directly into the I/Q demodulator/pilot generator/first error amplifier block 400. The output Ve1 is an input in the Process No. 1 which in turn generates a control signal for controlling the gain and phase adjustment circuit 106.

The I/Q demodulator/pilot generator/first error amplifier block receives an output of the asymmetric carrier cancellation network detector 300 as well as a portion of its own output that is coupled to or fed back to the I/Q demodulator/ power generator/first error amplifier block 400 via coupler 190. Based on these two input signals, the I/Q demodulator/ power generator/first error amplifier block generates an output signal that is coupled into coupler 160. A portion of this signal is coupled into the path located between delay line 155 and delay line 170.

The other output of divider 115 is input into delay line 120. Delay line 120 outputs a signal into the conventionally constructed summing junction 130, which also receives an input signal that is generated by the amplitude and phase adjustment circuit 185. Based on these signals and algebraic signs assigned at the ports they are input to, the summing junction generates an output signal. The output of the summing junction 130 is coupled through a coupler 140 directly to amplitude and phase adjustment circuit 195, which receives a control signal from Process No. 2. Based on the control signals from Process No. 2, the amplitude and phase adjustment circuit 195 generates an output signal that is fed into the second error amplifier block 500. The second error amplifier block 500 amplifies the input and generates an output signal which is fed directly into coupler 175. Coupler 175 couples a portion of the output signal from the second error amplifier block 500 into the path between the delay line 170 and the RF output 900.

A portion of the output of summing junction 130 is coupled to the carrier cancellation detector 720 via coupler 140. Using this signal as an input, the carrier cancellation detector 720 generates a signal Ve2a that is input into Process No. 2. Process No. 2 then generates the control signal output for controlling the amplitude and phase adjustment circuit 195.

Directional coupler 160 is utilized for the first IMD cancellation loop. A portion of the forward power delivered from main amplifier 200 and coupled through delay line 155 is lost as a heat in the directional coupler 160 dump load.

In this embodiment of the DLFFPA, a first error amplifier is gain and phase stabilized and thus used for partial IMD cancellation in the injection coupler 160. In contrast to conventional approaches, this circuit topology allows for use of the first error amplifier as both an output booster amplifier and also to provide partial IMD cancellation. Conventional techniques did not address output power boost capability. Consequently, operation of the first error amplifier tends to result in minimized losses in a dump load and additional output power delivered through the first injection coupler 160.

Monitoring load power tends to aid load power minimization. Excess carrier power produced by the first error amplifier 400 tends to be detected and minimized by the first loop action. In order to accomplish dump load power minimization, and power boost capability an asymmetric carrier cancellation junction/detector circuit 300 is used.

Figure 13B:
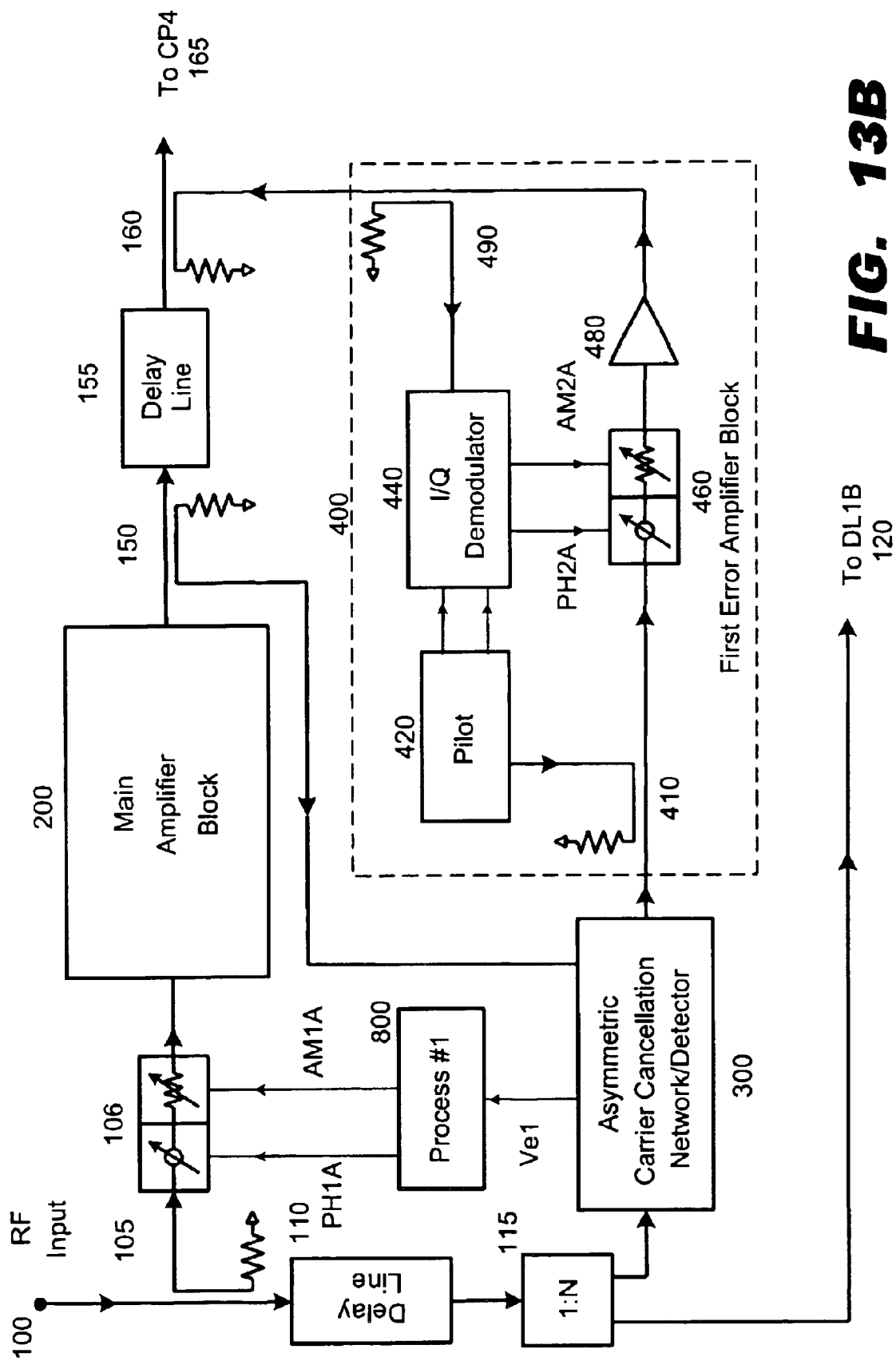
FIG. 13B further illustrates a first embodiment of the I/Q demodulator/pilot generator/first error amplifier block of FIG. 13A.

FIG. 13B is a block diagram of a DLFFA having the I/Q demodulator/pilot generator/first error amplifier block 400 (of FIG. 13A) in more detail. The embodiment includes an RF input signal port 100, a coupler 105, a phase and gain adjustment circuit 106, a main amplifier block 200, a coupler 150, a delay line 155, injection coupler 160, a delay line 110, a divider network 115, and an asymmetric carrier cancellation network/detector block 300. Block 400 includes: a pilot injection coupler 410, a pilot generator 420, an I/Q demodulator block 440, a coupler 490, a phase and gain adjustment circuit 460, and an error amplifier 480.

The amplitude and phase adjustment circuit 460 receives a phase adjustment signal ph2A and an amplitude adjustment signal am2A that are outputs from the I/Q demodulator block 440. The gain and phase adjustment circuit 460 utilizes these control signals to adjust the amplitude and phase of the input RF signal from asymmetric carrier cancellation network/detector block 300, that is output to the error amplifier block 400.

The error amplifier 480 generates an output RF signal that is coupled directly to injection port of coupler 160 and partially coupled via coupler 490 to the I/Q demodulator block 440, as one of its inputs.

The I/Q demodulator block 440 receives two input signals from the pilot generator 420 as well as a portion of the output signal of the error amplifier 480. By comparing the signals from the pilot generator 420 to the signals from coupler 490 the phase and amplitude control signals ph2A, am2A are generated. The pilot generator 420 also produces pilot signal that is coupled to the input of the error amplifier via pilot injection coupler 410.

Figure 14:
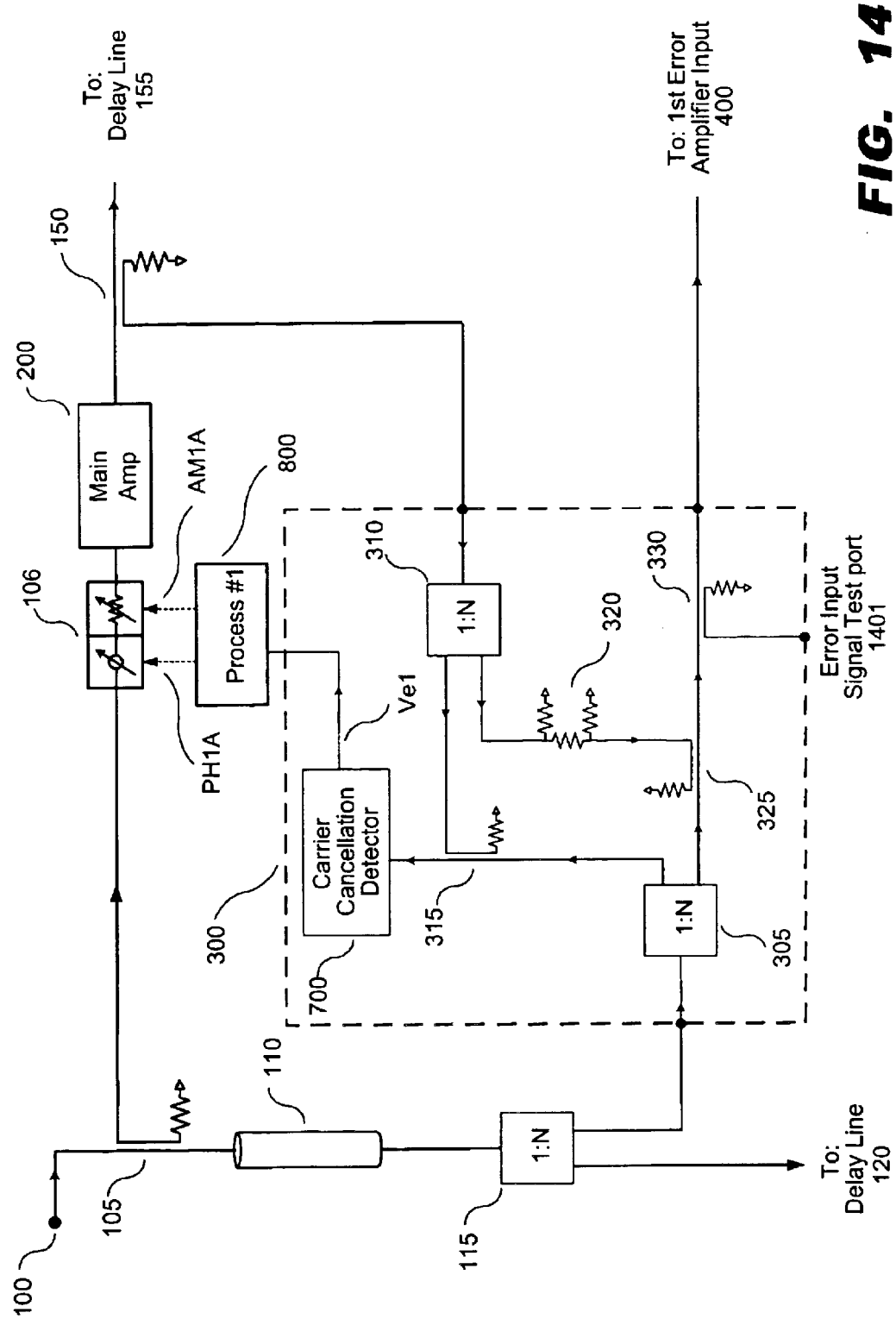
FIG. 14 illustrates a second embodiment of the asymmetric carrier cancellation detector (300 of FIGS. 13A and 13B)

FIG. 14 is a block diagram of the asymmetric carrier cancellation detector 300 of FIG. 13A. The asymmetric carrier cancellation detector includes a divider 305, a coupler 315, a carrier cancellation detector 700, a coupler 325, an attenuator network 320, a divider network 310 and a coupler 330.

The input RF signal 100 is coupled through coupler 105, delayed by the delay line 110 and a portion of the RF input signal is coupled through the divider 115 to the input of the divider 305. The power divider 305 then outputs two output signals. The first signal is coupled through coupler 315 into the carrier cancellation detector 700. The other output serves as an input to the first error amplifier 480 through coupler 325 and 330. The output from the main amplifier 200 is coupled via coupler 150 and input into the divider network 310, which in turn generates two output signals. The first output signal of the divider 310 is coupled via coupler 315 into the path located between divider network 305 and carrier cancellation detector 700.

The carrier cancellation detector 700 utilizes a portion of the first output signal from divider 310 and the first output signal from divider 305 to generate an output control signal Ve1 that serves as an input to Process Block No. 1, 800 and is responsible for generating a control signals AM1A and PH1A for the amplitude and phase adjustment circuit 106. The second output of the divider network 310 is input into attenuator network 320 which generates an output signal that is coupled via coupler 325 to the path located between divider network 305 and the input of the first error amplifier block 400. An error input signal test port 1401 is also provided that is used to couple a sample of error input signals to the first error amplifier input. Thus, the input to the first error amplifier comprises signals from the second output of the divider network 305, coupler 325.

A sample of main amplifier 200 output signals are coupled by directional coupler 150 to conventionally constructed power divider network 310. First output of the power divider network 310 is connected to an injection port of a conventionally constructed directional coupler 315. Carrier cancellation occurs in a summing junction, which is shown as conventionally constructed directional coupler 315.

In conventional approaches, the detected carrier canceled signal was applied to the input of error amplifier. According to an aspect of this invention, however, the carrier cancelled signal produced in summing junction 315 is not applied to the first error amplifier signal input port. This version of the carrier-cancelled signal is only used for loop control process #1. Secondary carrier cancellation junction is formed when the second portion of input signals are delivered from divider network 305 and combined with the balance of attenuated signals from the main amplifier output 150. Main amplifier output sample signals are delivered from a conventional divider network 310 through attenuator network 320 to a summing junction 325. As a result, an asymmetrical or unbalanced bridge is formed.

When attenuator 320 is set to 0 dB attenuation, and the two divider networks 305, 310 have identical signal division ratios, and if summing junctions 315 and 325 have identical summing ratios, then a balance bridge is formed. However, in the invention, an unbalanced bridge is used to deliver extra delayed input signals to the input of the first error amplifier. If the two divider networks are closely matched and if summing junctions 315 and 325 are matched as well then the level of extra delayed input carrier power will be strictly determined by the value of attenuator 320. The resultant signal present at the output of the summing junction 325 is applied to the input of the first error amplifier module 400. A conventional directional coupler 330 can be used to monitor input RF signal to the input of the first error amplifier.

The stabilized error amplifier feedforward amplifier system, in practice, tends to produce sufficient distortion suppression. When operating to produce less distortion suppression than a conventional feedforward amplifier. However, here distortion reduction achieved is sufficient.

Figure 15:
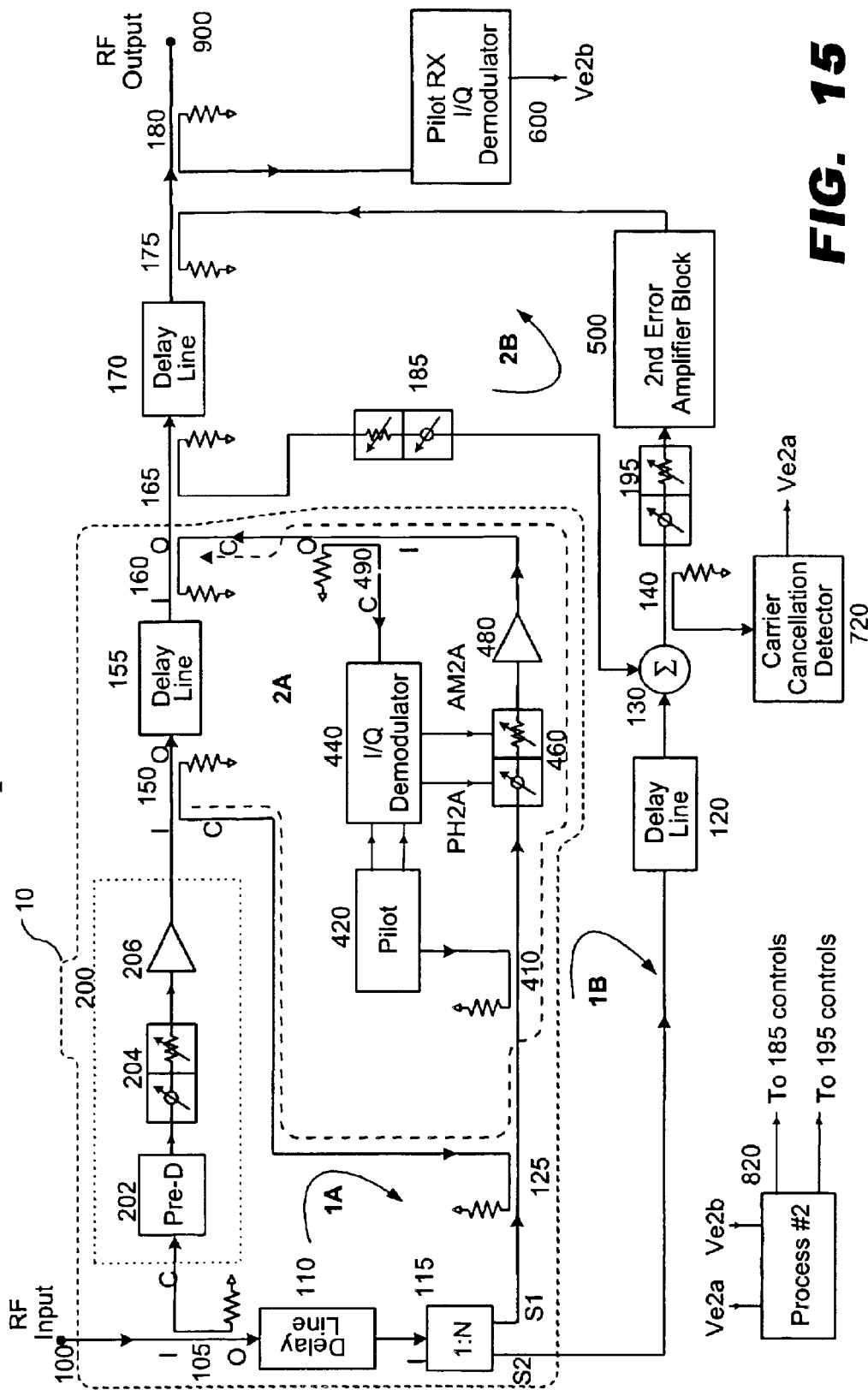
FIG. 15 is a block diagram of a dual loop feedforward power amplifier (DLFFPA) including, phase and gain control of the first error amplifier A5, carrier re-injection at coupler 160 and utilization of a common pilot across loops 1A and 1B.

FIG. 15 is a block diagram of a dual loop feedforward power amplifier (DLFFPA) including, phase and gain control 460 of a conventionally constructed first error amplifier (A5), carrier re-injection at conventionally constructed coupler 160 and utilization of a common pilot across two loops. The DLFFPA comprises feedforward power amplifier 10 (that includes loops 1A and 2A) and additional loops 1B and 2B. The first loop, 1A, is the carrier cancellation loop. In loop 1A, an error signal representative of the error products produced by the main amplifier A2, is extracted. The output of loop 1A is an error signal representative of the distortion produced in main amplifier A2. Additional loops 1B and 2B are utilized to cancel small signal distortions that are typically not satisfactorily reduced by a single feedforward amplifier 10.

Loops 1A and 2A operating together form a feedforward amplifier that is used as a main amplifier gain block in a second feedforward amplifier that includes of loops 1B and 2B. Loop 1B is configured to cancel the carrier present at the output of the feedforward amplifier 10 being used as a main amplifier. Loop 1B carrier cancellation is controlled by the conventionally constructed gain and phase adjustment circuit 185 disposed between coupled port of the directional coupler 165 and second carrier cancellation junction 130. Controlling gain and phase here does not affect the operating point of loops 1A and 2A. Interaction between first and second feedforward amplifiers formed by in loop pairs 1A, 2A and 1B, 2B respectively, tends to be minimized.

An error signal is produced by subtracting an attenuated copy of the main amplifier signal from a delayed copy of the input signal, present at this output of the gain and phase adjusting circuit 195. This is the conventional method of producing an error signal, as known to those skilled in the art. However, the placement of the gain and phase 185 tends to reduce loop interaction.

A problem with dual loop feedforward power amplifiers is that there are typically twice as many controls than are necessary to achieve an acceptable level of performance. These controls need monitoring and adjustment, impacting performance. The adjustment of more controls than are actually needed, often leads to undesirable effects in the output spectrum. The output spectrum typically sees degradation arising from increased intermodulation products present at the output of the feedforward amplifier.

A typical adjustment of the feedforward amplifier is to try to reduce the distortion products to an absolute minimum. However, if an attempt to reduce distortion to an absolute minimum is not desired, then amplifier control may be simplified. If maximum distortion reduction in the amplifier is not sought, a compromise between the performance required of the amplifier, and what is easily achievable in amplifier performance may be found.

A typical feedforward amplifier typically has 25 to 30 dB of cancellation. In an ideal dual loop amplifier, a typical cancellation of 60 dB should be possible by adjusting all of the controls in the most effective manner. Typically performance of this theoretical level is not needed in most existing practical application. A performance level of 45 to 50 dB is typically desirable in most applications.

In an embodiment of the invention a cancellation of 45 to 50 dB may be achieved, with one of the loops 2A, and its control, simplified. In the embodiment of the invention the first nested loop is simplified such that it functions independently of all of the remaining amplifier operation.

A first IMD cancellation loop (2A) is formed as shown. Loop 2A is similar in function to the second loop in a conventional feedforward amplifier. Loop 2A is formed by the path through the output coupler 150 disposed after main amplifier A2, carrier cancellation coupler 125, the pilot injection coupler 410, the path through the phase and gain adjusting circuits 460, the path through first error amplifier A5, first sampling coupler 490 and terminating at the injection coupler 160 of module A3. Module A3 includes a first injection coupler 160 at its input, second sampling coupler 165, a delay line 170, and a second injection coupler 175 at its output. The output of main amplifier module A2 is coupled to a directional coupler 150, conventionally constructed delay filter 155 coupled to the input of the module A3.

A common path between Loop 1A and 2A is formed where a sample of the main amplifier A2 is coupled 150 to a coupled port of a carrier cancellation coupler 125 to generate an error signal for use in Loop 2A signal.

For the loop to close, that is, for cancellation to occur, the phase in the first path must differ by the phase of the second path by 180 degrees, and the amplitude of the signal in the first path must be equal to the amplitude and signal in the second path, as well as signal delay through the branches are identical. If these conditions are met, then perfect cancellation will occur in the injection coupler 160 of module A3.

The delay line or delay filter 155 is a passive component. Under normal operating conditions, changes in phase and gain of the delay element are virtually non-existent or very small. However, changes in gain and phase are typically greater in the error amplifier of module A5 than in delay line. As can be seen, in loop 2A, the only components that would change the gain or phase are the active components. However, over time, due to temperature and aging effects, perfect cancellation is typically degraded because of variations in phase and gain in the amplifiers other active components, such as I/Q modulators utilized in the construction of FFPA.

To maintain constant gain and phase characteristics in any given loop of a feedforward amplifier, several methods may be utilized. One method is to monitor in spectral output of the feedforward amplifier. In the present embodiment of the invention of a dual loop feedforward amplifier using a phase and gain controlled error amplifier, the error amplifier transfer characteristic is stabilized. To stabilize the error amplifier, conventionally constructed automated phase control (APC) and conventionally constructed automatic gain control (AGC) are applied to the error amplifier. Thus, with the stabilized error amplifier path, the loop 2A cancellation performance need not be monitored. IMD cancellation performance at injection coupler 160 will not be optimum, when compared to a single loop system, but good enough for a dual loop feed forward power amplifier (DLFFPA) implementation.

Outermost loop 2B utilizes a pilot tone to achieve gain and phase stabilization of the second error amplifier A7. Stabilization of the second error amplifier A7 is achieved by electronically monitoring cancellation performance of a pilot tone at the injection coupler 175, by monitoring the pilot signal levels at the output signal coupler 180 and controlling it accordingly. A pilot tone is used to monitor the IMD cancellation performance of loop 2B.

However, the pilot tone is not used as it would be in a conventional feedforward amplifier. In the embodiments of the invention, the pilot is used only to monitor and adjust the performance of the second error amplifier A7, and not the performance of a loop, such as loop 2A. In the embodiments of the invention, pilot phase and amplitude present at the input of the first error amplifier A5 are compared to a pilot phase and amplitude present at the output of the first error amplifier A5. This is the APC and AGC function.

A carrier cancellation coupler 125 is disposed at the input of the module A4. An input port of the first carrier cancellation coupler 125 is coupled to a forward coupled port S1 of a signal splitter 115. An output port of the carrier cancellation coupler 125 is coupled to an input port of the pilot injection coupler 410 of module A4. A pilot signal from a pilot generator 420 is coupled to an injection port of the injection coupler 410. An output port of the pilot injection coupler 410 is coupled to the phase and gain adjusting network 460.

The signal source 420 produces an I-Q modulated pilot tone, which is produced by conventional means known to those skilled in the art. The signal source injects the pilot tone into the input of the error amplifier A5. An amplified pilot signal is produced by the error amplifier A5. The phase and gain of the amplified pilot signal is compared to the phase and gain of the input pilot signal. Information gained from the comparison is used to generate phase and gain control signals for gain and phase shifter networks.

The error amplifier module A5 output is coupled to a pilot sampling coupler 490. An output of pilot sampling coupler 490 is coupled to an injection port of an injection coupler 160 in the main amplifier path. A forward port of the pilot sampling coupler 490 is coupled to a first input of an I-Q demodulator module 440. A pilot signal source 420 output is coupled to a second input of the I-Q demodulator 440. The first output of the I-Q demodulator is coupled to a phase shifting circuit 460 while the second output of the I-Q demodulator is also coupled to the gain control circuit 460 in module A4.

The I-Q demodulator 440 provides control signals to continuously compensate for the error amplifier gain and phase variation over time that will yield a desired performance at the output of the loop. The delay line 155, the coupler 150 of the input delay line, and first injection coupler 160, first carrier cancellation junction 125 and pilot sampling coupler 490 are passive and their properties do not change significantly over time. Thus, the overall performance that is being monitored is that of the error amplifier A5. This approach provides the advantage of utilizing only a single pilot.

In prior conventional dual loop feedforward amplifiers two pilot tones are typically utilized. With the simplified approach used in the embodiments of the invention, two interacting loops are eliminated. By eliminating loop interaction, a somewhat independent hierarchy of loop performance may be obtained, allowing the performance of each of the loops to be adjusted independently of the other loops.

The gain and phase stabilization of the error amplifier A5 is independent of the loop controls. The error amplifier loop does not require microprocessor control and is self-adjusting. This allows a hierarchical feedforward amplifier control system to be implemented.

The outer loops (1B and 2B) are actively controlled through the microprocessor. The inner loop is a quasi passive loop that utilizes a pilot whose function is to stabilize the gain and phase of the first error amplifier A5. In an embodiment of a feedforward amplifier utilizing a single pilot across two loops the single pilot may be utilized to control the first error amplifier A5, and to control the outer loop 2B. The outer loop (Loop 2B) is controlled in a conventional manner known to those skilled in the art.

The degree of distortion cancellation in a feedforward amplifier may be measured by monitoring the power dissipated in first injection coupler 160 load in module A3. Module A3 includes two injection couplers (or 160 and 175 IMD cancellation couplers) A delay line 170 for Loop 2B is disposed between second sampling coupler 165 and second injection coupler 175. The injection couplers are typically 10 dB couplers, having a typical insertion loss of 0.5 dB. Each time the amplifier output signal passes through such coupler, it is reduced by the inherent insertion and coupling losses typically encountered in the injection coupler as well as losses associated with the delay line 155.

To counter the losses associated with the power dissipated in the load coupled to the directional coupler 160 encountered in conventional signal circuits, re-injection method is implemented. To reduce power dissipation in the load, cancellation of signals applied to the load is used. Thus, if two signals appearing at the load by way of coupling from the main amplifier path and from the first error amplifier path should be nearly identical in amplitude and 180 degrees opposite in phase to cancel.

The energy dissipated in the injection coupler load is negligible because the signal appearing at the load are of opposite phase and tend to cancel when their amplitude are adjusted to be substantially equal.

Figure 16:
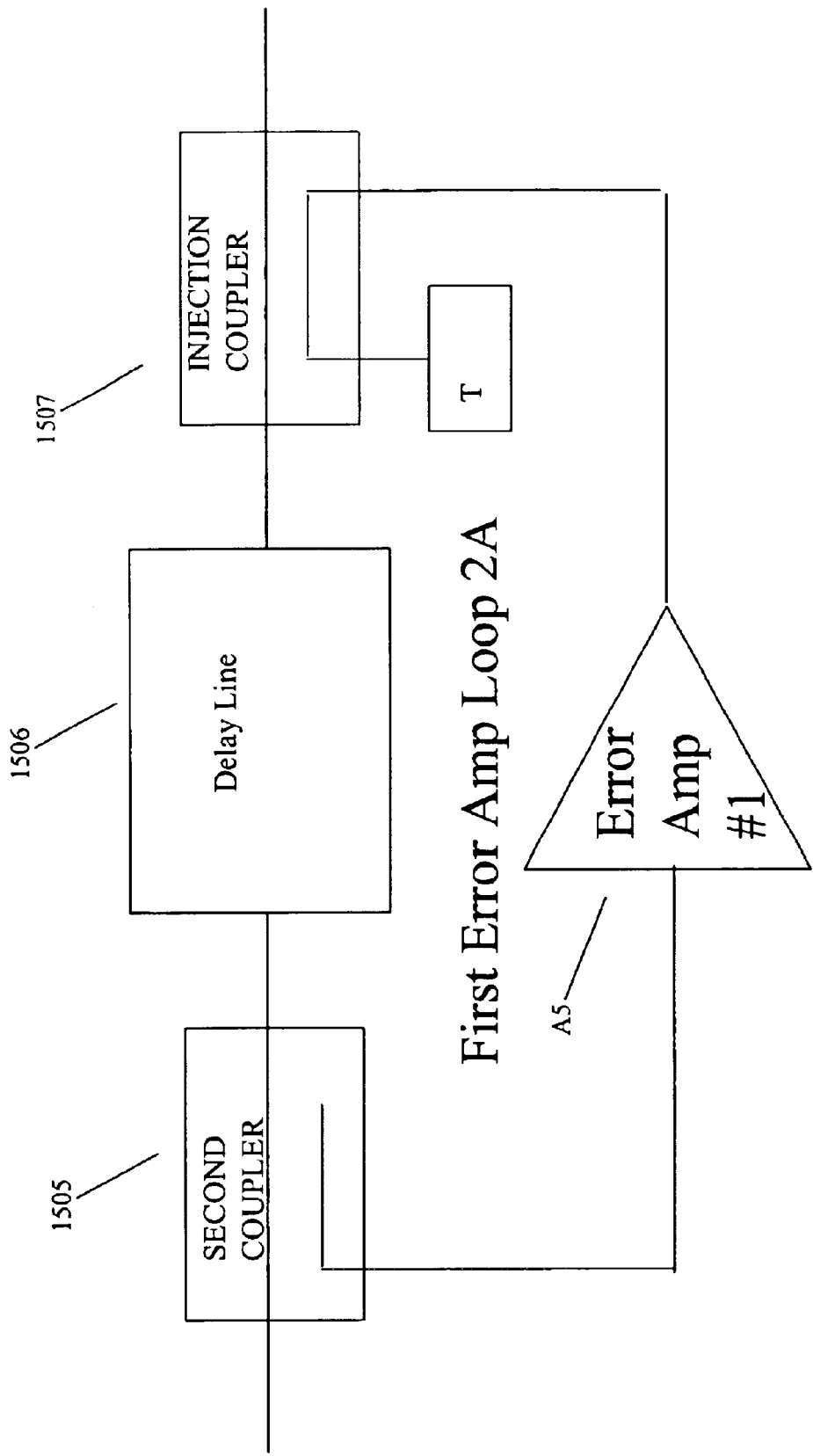
FIG. 16 is a block diagram illustrating how the error amplifier is stabilized.

FIG. 16 is a block diagram illustrating the principal components in a loop 2A incorporating a stabilized error amplifier A5. In stabilizing the error amplifier A5, we note that the delay line 1506, second coupler 1505 and injection coupler 1507 typically do not vary, and the error amplifier typically tends to provide the most variations in loop cancellation performance. If we are certain within limits that the gain and phase of the error amplifier will remain stable over operating condition, then a reasonable amount of cancellation will be achieved. Thus, by stabilizing transfer function of the error amplifier within reasonable limits, a reasonable amount of loop performance, or cancellation may be achieved.

Conventional pilot controlled feedforward amplifiers typically do not measure the spectral purity at the output of the error amplifier. In the embodiments of this invention, the loop containing the error amplifier is typically not an actively adjusting loop. An actively adjusting loop in a feedforward loop that undergoes more or less constant adjustment of phase and gain controls in an effort to achieve an optimized cancellation. In alternative embodiments, the error amplifier A5 loop 2A may utilize active adjustments, such as look-up table compensation, pilot control and the like.

Figure 17:
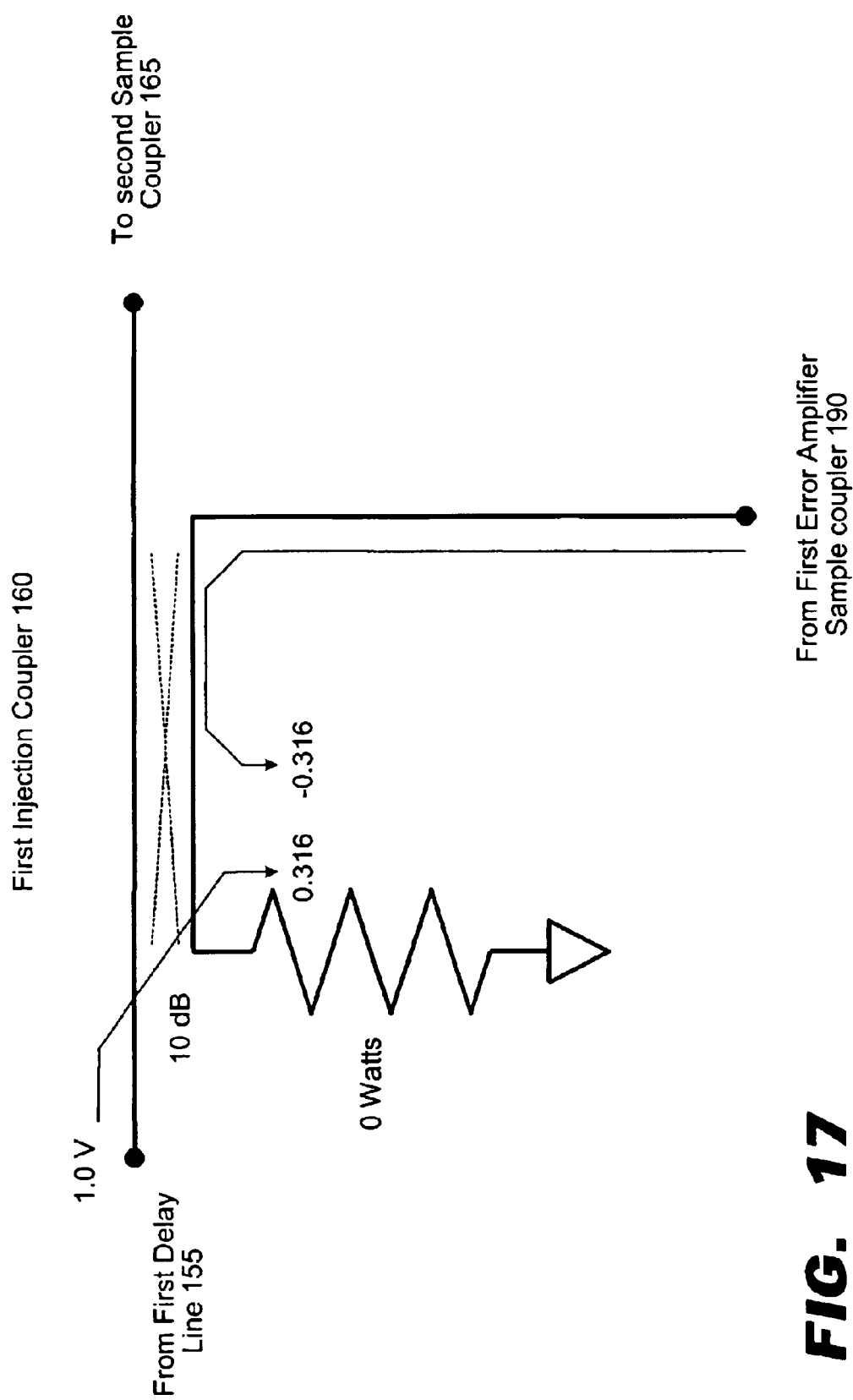
FIG. 17 is a schematic diagram illustrating the carrier cancellation process at the first injection coupler (160 of FIG. 13A)

FIG. 17 is a schematic diagram illustrating the cancellation process. For example, if a one volt signal is present at port 1 of a 10 dB coupler then a 0.316 volt signal is induced in the forward coupled port. The signal present at the coupled port travels to a termination or dump port where it is typically dissipated as heat in a resistive load. However, if an error amplifier coupled to port 2 of the 10 dB coupler produces a 0.316 volt signal that is 180 degrees out of phase with the signal being coupled from port 1 to port 2 then the signals have opposite polarity and cancel out. Thus, no RF energy is dissipated in the termination when the amplitude of the signals are equal and their phases are substantially 180 degrees apart.

The power dissipation in the coupler termination may be utilized as an indication of the degree of cancellation present in the feedforward amplifier. Amplitude and phase adjustments prior to the main amplifier may be controlled by monitoring power dissipation in the dump port resistor, and adjusting the phase and gain of the signal input to the main amplifier until the dissipation in the dump port resistor has been minimized.

To counter losses associated with the power dissipated into the load coupled to the directional coupler 160, a signal re-injection method can be implemented. In order to reduce power dissipation in the load, a cancellation of signals applied to the load is used. Thus, signals appearing at the load due to coupling from the main amplifier path and first error amplifier path should be nearly identical in amplitude and 180 degrees opposite in phase.

If a one volt main amplifier output signal is present at the input port of injection coupler 160, then a 0.316 volts of this signal will be induced into the forward coupled port which is connected to the load. Thus, due to coupling losses, only 0.684 volts of the original signal will appear at the output port of injection coupler 160.

Reducing forward power losses in the output path from the main amplifier can be advantageous. This loss minimization can be accomplished, for example, with the error amplifier delivering 0.316 volts of carrier signal 180 degrees out of phase with coupled main signal. The two signals effectively cancel each other, thus resulting in approximately no coupling losses in the first injection coupler 160. When it is assumed that the spurious levels are not significant contributors to the measured power, the incident average power (P1) at the input port of injection coupler from the main amplifier can be determined by the following formulas:

$$P_1 = P \times (1-C) \qquad (1)$$

Where P is the average power on the output side of the injection coupler, and C is the coupling factor (in power, i.e. C=0.1 for a 10 dB coupler). The average power (Pe) from the error amplifier, can then be determined using the following formula:

$$P_e = \frac{P_1 * C}{1 - C} \qquad (2)$$

For example, if a 10 dB coupler is utilized, and injection is used, then the power from the main amplifier is 90% of the desired output power from the coupler and the power from the error amplifier is 10% of the output power from the coupler.

Without injection, the power P1 from the main amplifier is equal to:

$$\frac{P}{\sqrt{1-C}} \qquad (3)$$

Thus, without injection, the power from the main amplifier would be 5.4% higher than the average power on the output side of the injection coupler P or a total of 17% higher than it would be using injection. If a 6 dB coupler were utilized, then the power from the main amplifier would be 1 dB lower than the desired output power or 40% lower than if injection were not utilized with a 10 dB coupler.

Once the desired power from the error amp Pe and the desired output power are known, then the following formulas can be used to determine the coupling factor (C) and the incident average power (P1) at the input port of the injection coupler from the main amplifier:

$$C = \frac{P_e}{P} \qquad (4)$$

$$P_1 = P - P_e \qquad (5)$$

Figure 18:
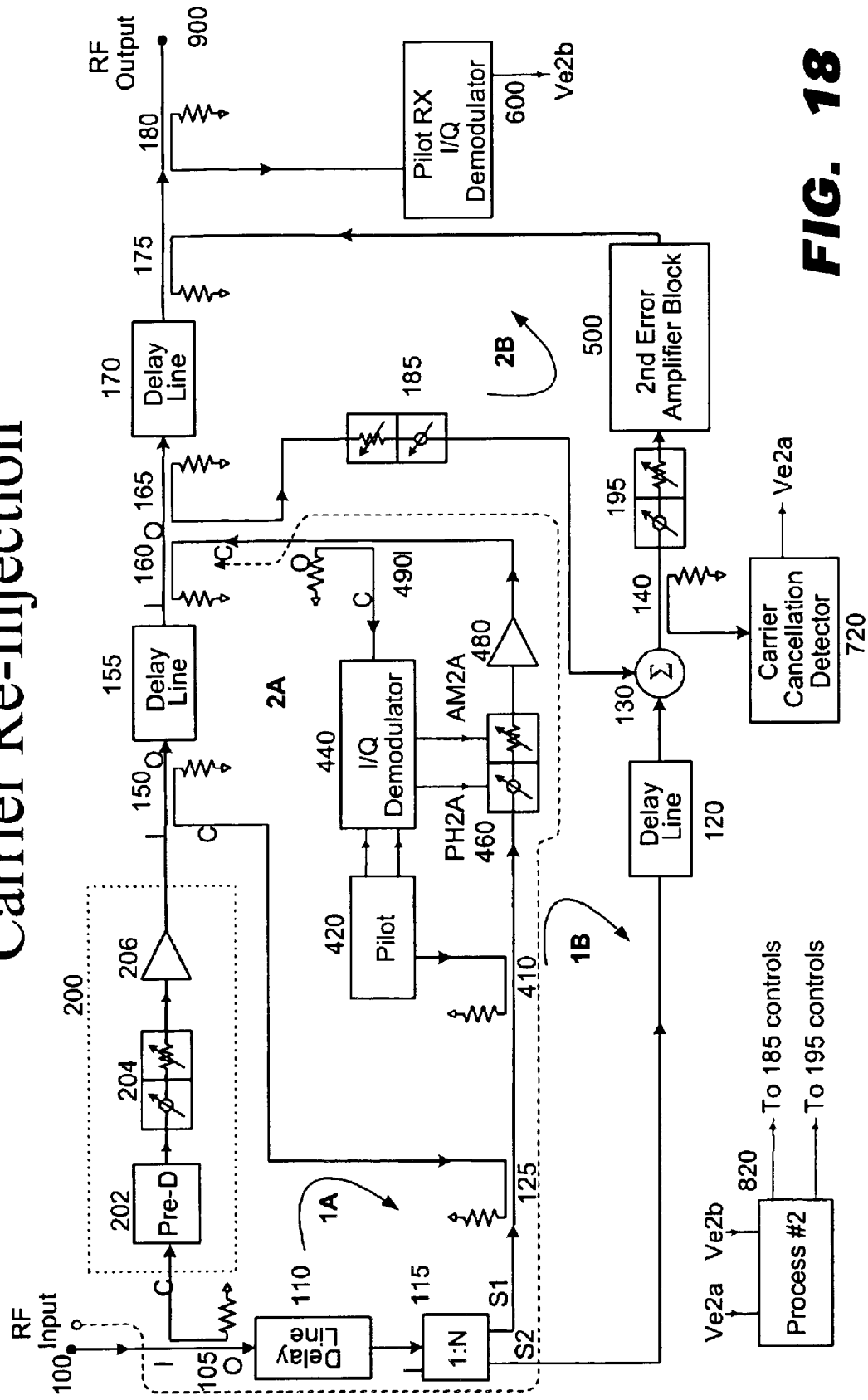
FIG. 18 is a block diagram of an embodiment of feedforward amplifier that tends to improve the distortion cancellation process by carrier reinjection.

FIG. 18 is a block diagram of an embodiment of feed-forward amplifier that tends to improve the efficiency of the feed forward amplifier by carrier reinjection. A first conventionally constructed coupler 105 includes an input I having an RF input signal applied to it. Coupled port C of the first coupler 105 is coupled to an input of a conventionally constructed pre-distorter 204 and conventionally constructed phase and gain adjuster 204 module A1. The output of module A1 is coupled to an input of a conventionally constructed RF power amplifier, A2. An output of the RF power amplifier is coupled to an input I of a conventionally constructed second coupler 150. An output O of the second coupler 150 is coupled to an input of a conventionally constructed delay line 155. Here the delay line is equivalently constructed as a delay filter, as known to those skilled in the art. An output of the delay line is coupled to an input I of a conventionally constructed third, or injection, coupler 160. Here, injection coupler 160 is disposed in module A3. An output O of the third coupler 160 provides the amplified main signal.

An output port O of the first coupler 105 is coupled to a first input of a conventionally constructed delay line 110. An output of the delay line is coupled to a conventionally constructed RF signal splitter 115. Alternatively, a subtraction junction may be used. A first output S1 of the splitter 115 is coupled to an input I of a conventionally constructed fourth coupler 125. FIG. 18. Output of coupler O 125 be coupled to an input I of conventionally constructed fifth directional coupler 410. An output O of the fifth coupler is coupled to an input of a conventionally constructed phase and gain adjusting circuit 460. An output of the phase and gain adjusting circuit 460 is coupled to an input of a conventionally constructed first error amplifier A5. The output of the amplifier A5 is coupled to an input a coupled port I of a conventionally constructed directional sixth coupler 490. A forward coupled port C is coupled to an input of a conventionally constructed I/Q demodulator 440. Sixth coupler 490 output O is coupled to a coupled port C of a conventionally constructed injection coupler 160.

Loop 2A is also used to re-inject amplified input carriers at the delayed output of the main amplifier, through the injection coupler 160 located in module A3. The carrier injection level is measured at the coupler termination by a detector T, which is configured as an injection detector by methods known to those skilled in the art.

Reinjection of amplified input carriers tends to reduce signal loss encountered in the injection coupler 160.

In previous design approaches, a portion of the input signal was typically coupled into the error amplifier A5 to make up for the signal level differences and to achieve dump load signal cancellation.

The present invention utilizes an amplitude and phase adjuster 204 inserted between the input coupler 105 and the amplifier A2 to control distortion cancellation in the signal being generated by the Main Amp A2 and to provide carrier reinjection. In the present embodiments, the level of carrier reinjection at the subtraction junction 160 is monitored, at the termination T1. The gain and phase adjuster 204 is adjusted until the power dissipated in the load detected by a detector T is minimized. Thus, by adjusting a phase and amplitude control circuit 204, power dissipated in the load is caused to be minimized, also tending to cause distortion cancellation to be optimized. Efficiency tends to be enhanced because reduced dissipation in the load is used as an indication that sufficient power has been added in the second loop for the error path to achieve the desired carrier reinjection. In this application, the error amplifier power rating is substantially smaller than the power amplifier. (A5 is substantially smaller than A2.)

Figure 19:
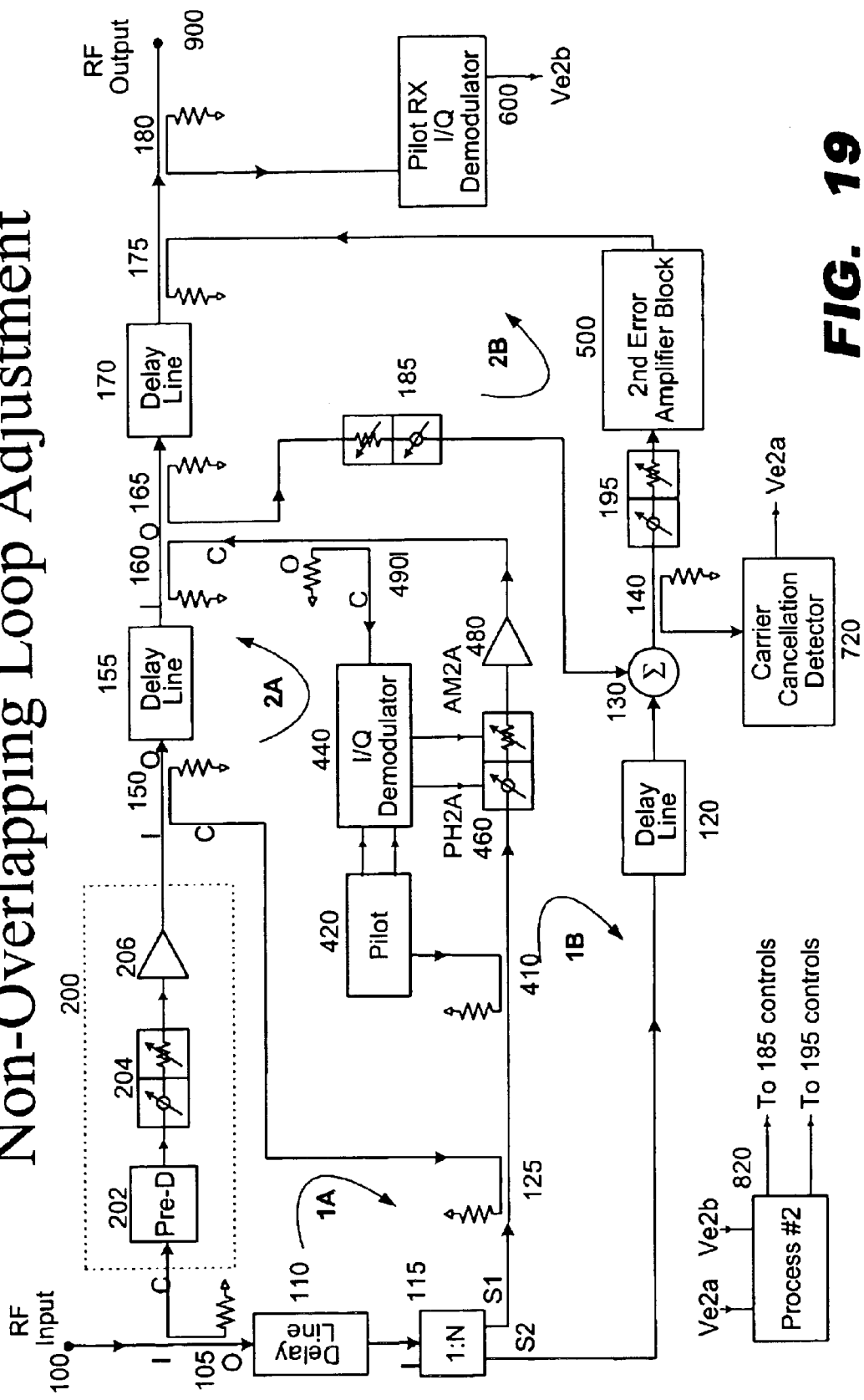
FIG. 19 is a block diagram of an embodiment of a feed-forward amplifier in which the control of a plurality of loops present are non-overlapping in their adjustment, through the use of a common pilot signal across loops 1A and 1B.

FIG. 19 is a block diagram of an embodiment of a feed-forward amplifier in which the control of a plurality of loops present are non-overlapping in their adjustment through the use of a common pilot signal across two of the loops. Four loops having non-overlapping controls are shown in the figure. Loop 2B provides final IMD cancellation. This IMD cancellation loop includes phase and amplitude shifters 195 in module A6 and those disposed between module A6 and module A3, 185.

The pilot signal from the pilot reference generator is injected into module A4 through an injection coupler 410 and is coupled to the error amplifier A5 input. The pilot signal at the output of the error amplifier in module A5 is sampled prior to module A3 at the error amplifier A5 output coupler 490 where it is coupled to the I-Q demodulator 440.

Pilot signal travels towards the output of module A3 via the injection coupler 160. The pilot signal is re-sampled by the sampling coupler 165 in module A3, and is passed through into the second loop (2B) through phase and gain shifter 185.

The pilot is thus reused in loop 2B. The reused pilot is injected into the second loop (2B) at the input of the A6 module. Typically, a pilot signal is injected into the main amplifier path; however, here the pilot is injected into the first error amplifier path of the first error amplifier loop (2A). The sampled pilot is coupled to the phase and gain adjusting circuits 195 of module A6 and then coupled to the second error amplifier of module A7. The pilot is reinjected at the error signal injection coupler 175 and then coupled to the pilot receiver 600 via output coupler 180.

Thus, a single pilot may be used to help provide two functions. First, the pilot is used for gain and phase stabilization in the first error amplifier A5, and second, to adjust IMD cancellation in outside loop (2B). Advantageously, these two control features are achieved without utilizing switches, hopping, or auxiliary electronics. By providing phase and amplitude adjusters 185 coupled in series between module A3 and module A6, the adjustment of the loop 2B by this phase and gain adjustment circuit does not affect the adjustment of any of the other two remaining loops.

Non overlapping adjustment of the loops tends to provide simplified tuning, and a reduction in the number of control signals that are adjusted. In a typical feed-forward amplifier, two loops are present where each loop has four control signals. And all four control signals are typically adjusted and readjusted at a very high rate of speed. The control of a loop 2B is typically slow. The first loop 2A has been stabilized by the gain stabilized error amplifier. In the present embodiment, six control signals are utilized rather than the typical eight.

The foregoing description of embodiments of the invention has been presented for the purposes of illustration and description. It is not intended to be exhaustive or to limit the invention to the precise form disclosed. Many modifications and variations are possible in light of the above teaching. It is intended that the scope of the invention not be limited by this detailed description, but by the claims appended hereto.

What is claimed is:

1. A feedforward amplifier, comprising:
   a pilot reference generator that generates a pilot signal;
   a first carrier cancellation loop;
   a first error amplifier loop including a first error amplifier, wherein the pilot signal is utilized to provide gain stabilization in the first error amplifier
   a third loop;
   a second carrier cancellation loop that includes a first phase and amplitude adjuster in module and a second amplitude and phase adjuster disposed between module and module, wherein the pilot signal is utilized to control the adjustment of the second carrier cancellation loop.

2. A feedforward amplifier according to claim 1, wherein the first error amplifier loop further comprises:
   an injection coupler, wherein the pilot signal is injected through the injection coupler;
   an error amplifier having an input that receives the pilot signal that is injected through the injection coupler and an output,
   wherein the output of the error amplifier is sampled at a sixth coupler to provide a sampled pilot signal and an unsampled pilot signal, wherein the sampled pilot signal is coupled to an IQ detector.

3. A feedforward amplifier according to claim 2, wherein the unsampled pilot signal is received via the injection coupler.

4. A feedforward amplifier according to claim 1, further comprising:
   a sampling coupler for sampling the unsampled pilot signal from the first error amplifier path of the first error amplifier loop, and reinjecting the unsampled pilot signal into the carrier cancellation loop to provide a reused pilot signal in the carrier cancellation loop 2B.

5. A feedforward amplifier according to claim 4, further comprising:
   a first phase and gain adjusting circuit,
   wherein the sampled pilot signal is coupled to the first phase and gain adjusting circuit; and
   a second phase and gain adjustment circuit,
   wherein the adjustment of the carrier cancellation loop by the second phase and gain adjustment circuit does not affect the adjustment of any other loop.

6. A feedforward amplifier according to claim 5, further comprising:
   a second error amplifier module, wherein the sampled pilot signal is coupled to the second error amplifier after being coupled to the first phase and gain adjusting circuit.

7. A feedforward amplifier according to claim 6, further comprising:
   an error signal injection coupler, wherein the pilot is reinjected at the error signal injection coupler; and
   a pilot receiver, wherein the pilot is coupled at the pilot receiver after being reinjected at the error signal injection coupler.

8. A feedforward amplifier according to claim 7, wherein the pilot reference generator, comprises:
   a quadrature modulated signal generator comprising a sinusoidal signal oscillator operating at a first frequency;
   a power splitter having two output ports closely matched in amplitude but differing in phase by 90 degrees at a first frequency;
   a first signal multiplier;
   a second signal multiplier;
   a power summer having two output ports closely matched in amplitude and phase at the first frequency, wherein the output of the summer is a quadrature modulated pilot signal;
   a first sinusoidal signal oscillator operating at a second frequency; and
   a second sinusoidal signal oscillator operating at a third frequency.

* * * * *

UNITED STATES PATENT AND TRADEMARK OFFICE
CERTIFICATE OF CORRECTION

PATENT NO. : 6,958,647 B2  
DATED : October 25, 2005  
INVENTOR(S) : Alex Rabinovich, Mark Gurvich and Jianqing He It is certified that error appears in the above-identified patent and that said Letters Patent is hereby corrected as shown below:

Title page,
Item [75], Inventors, "Jianquing" should be -- Jianqing --.

Signed and Sealed this

Twenty-seventh Day of December, 2005

JON W. DUDAS
*Director of the United States Patent and Trademark Office*